US009865581B2

(12) United States Patent
Jang et al.

(10) Patent No.: US 9,865,581 B2
(45) Date of Patent: Jan. 9, 2018

(54) METHOD OF FABRICATING MULTI-SUBSTRATE SEMICONDUCTOR DEVICES

(71) Applicant: Samsung Electronics Co., Ltd., Suwon-si, Gyeonggi-do (KR)

(72) Inventors: Joo-Hee Jang, Hwaseong-si (KR); Pil-Kyu Kang, Hwaseong-si (KR); Seok-Ho Kim, Hwaseong-si (KR); Tae-Yeong Kim, Suwon-si (KR); Hyo-Ju Kim, Seoul (KR); Byung-Lyul Park, Seoul (KR); Jum-Yong Park, Yongin-si (KR); Jin-Ho An, Seoul (KR); Kyu-Ha Lee, Yongin-si (KR); Yi-Koan Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/940,621

(22) Filed: Nov. 13, 2015

(65) Prior Publication Data
US 2016/0141282 A1    May 19, 2016

(30) Foreign Application Priority Data
Nov. 13, 2014    (KR) .................. 10-2014-0157801

(51) Int. Cl.
*H01L 25/00* (2006.01)
*H01L 23/532* (2006.01)
(Continued)

(52) U.S. Cl.
CPC ........ *H01L 25/50* (2013.01); *H01L 21/76829* (2013.01); *H01L 21/76832* (2013.01);
(Continued)

(58) Field of Classification Search
CPC . H01L 21/3212; H01L 25/50; H01L 25/0657; H01L 2224/32145
See application file for complete search history.

(56) References Cited

U.S. PATENT DOCUMENTS 6,653,224 B1    11/2003    Gotkis et al.
6,962,835 B2    11/2005    Tong et al.
(Continued)

FOREIGN PATENT DOCUMENTS

JP    2004-039879 A    2/2004
JP    3933332 B2    6/2007
(Continued)

*Primary Examiner* — Julia Slutsker
(74) *Attorney, Agent, or Firm* — Myers Bigel, P.A.

(57) ABSTRACT

A first insulating layer is formed on a substrate. An opening is formed in the first insulating layer. A barrier layer is formed on the first insulating layer and conforming to sidewalls of the first insulating layer in the opening, and a conductive layer is formed on the barrier layer. Chemical mechanical polishing is performed to expose the first insulating layer and leave a barrier layer pattern in the opening and a conductive layer pattern on the barrier layer pattern in the opening, wherein a portion of the conductive layer pattern protrudes above an upper surface of the insulating layer and an upper surface of the barrier layer pattern. A second insulating layer is formed on the first insulating layer, the barrier layer pattern and the conductive layer pattern and planarized to expose the conductive layer pattern. A second substrate may be bonded to the exposed conductive layer pattern.

20 Claims, 22 Drawing Sheets

(51) Int. Cl.
*H01L 21/768* (2006.01)
*H01L 27/146* (2006.01)

(52) U.S. Cl.
CPC .... *H01L 27/1469* (2013.01); *H01L 27/14634* (2013.01); *H01L 27/14636* (2013.01); *H01L 27/14643* (2013.01); *H01L 21/76831* (2013.01); *H01L 21/76885* (2013.01); *H01L 23/53223* (2013.01); *H01L 23/53238* (2013.01); *H01L 23/53266* (2013.01); *H01L 23/53295* (2013.01); *H01L 27/14621* (2013.01); *H01L 27/14623* (2013.01); *H01L 27/14627* (2013.01); *H01L 2224/0508* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05547* (2013.01); *H01L 2224/05624* (2013.01); *H01L 2224/05647* (2013.01); *H01L 2224/05655* (2013.01); *H01L 2224/08121* (2013.01); *H01L 2924/0002* (2013.01)

(56) References Cited

U.S. PATENT DOCUMENTS

| | | | |
|---|---|---|---|
| 7,553,757 | B2 | 6/2009 | Matsumori |
| 7,585,782 | B2 | 9/2009 | Greeley et al. |
| 8,232,200 | B1 | 7/2012 | Oh et al. |
| 2012/0193809 | A1* | 8/2012 | Chung ................ H01L 25/0657 257/774 |
| 2013/0334639 | A1 | 12/2013 | Kerwin |
| 2015/0108644 | A1* | 4/2015 | Kuang .................... H01L 24/06 257/751 |
| 2015/0171050 | A1* | 6/2015 | Chen ....................... H01L 24/03 257/784 |

FOREIGN PATENT DOCUMENTS

| | | |
|---|---|---|
| KR | 10-2002-0050923 A | 6/2002 |
| KR | 10-2002-0056010 A | 7/2002 |
| KR | 10-2003-0096828 A | 12/2003 |
| KR | 10-2006-0094322 B2 | 8/2006 |
| KR | 10-2009-0074473 A | 7/2009 |
| KR | 10-2011-0047568 A | 5/2011 |

* cited by examiner

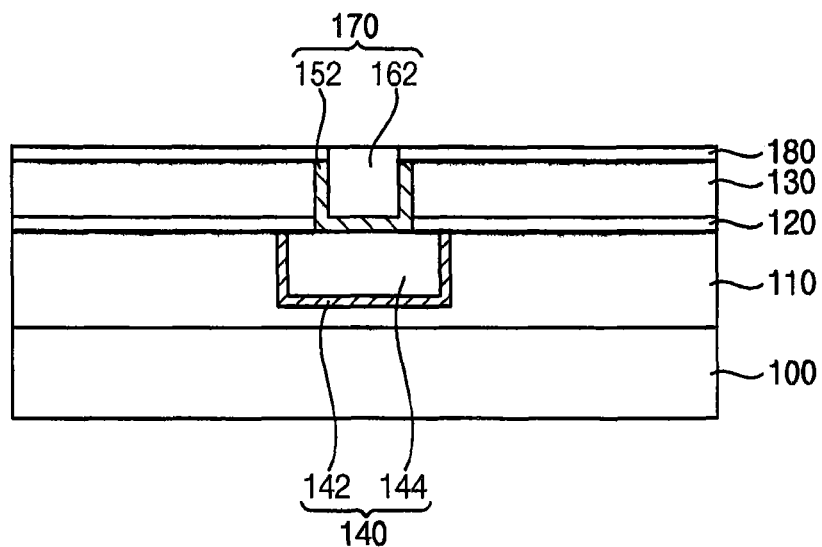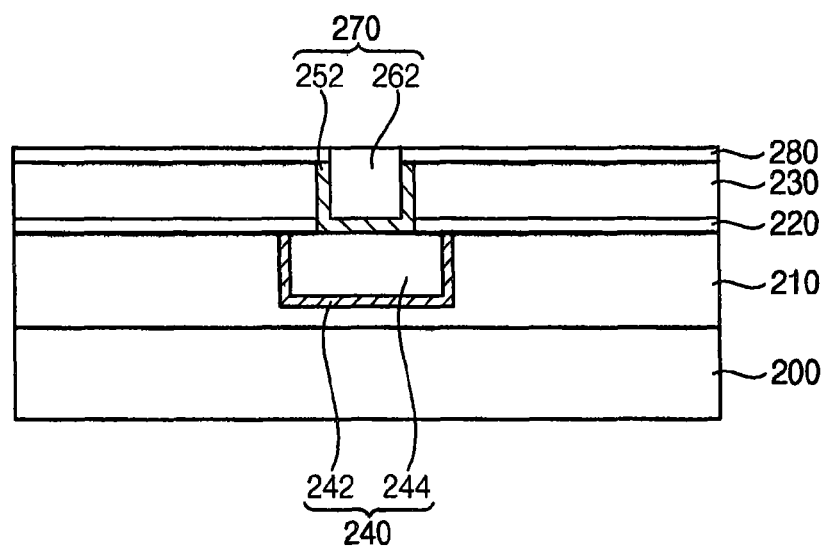

METHOD OF FABRICATING MULTI-SUBSTRATE SEMICONDUCTOR DEVICES

CROSS-REFERENCE TO RELATED APPLICATION

This application claims priority under 35 USC §119 to Korean Patent Application No. 10-2014-0157801, filed on Nov. 13, 2014 in the Korean Intellectual Property Office (KIPO), the contents of which are herein incorporated by reference in their entirety.

BACKGROUND

1. Field

Example embodiments relate to a methods of manufacturing semiconductor devices and, more particularly, to methods of manufacturing multi-substrate semiconductor devices.

2. Description of the Related Art

In order to increase integration of semiconductor devices, techniques involving stacking semiconductor chips, semiconductor packages, or substrates have been developed. Chip-on-Chip (CoC) and Package-on-Package (PoP) structures may be implemented using such techniques. When substrates each having an insulating interlayer containing a conductive pattern are bonded together to form a stacked structure, it is desirable that the conductive patterns and the insulating interlayers of the substrate be well bonded so that the resultant stacked structure may have high electrical reliability.

SUMMARY

Example embodiments provide methods of manufacturing semiconductor devices having a stacked structure and a good electrical reliability.

According to some example embodiments, methods of manufacturing a semiconductor device include forming a first opening in a first insulating interlayer on a first substrate, forming a first barrier layer in the first opening and on portions of the first insulating interlayer adjacent the first opening, and forming a first conductive layer on the first barrier layer. The first conductive layer and the first barrier layer are chemical mechanical polished to expose a top surface of the first insulating interlayer and form a first conductive pattern structure having a first barrier layer pattern and a first conductive pattern on the first barrier layer pattern. The first conductive pattern has a top surface higher than a top surface of a portion of the first barrier layer pattern on a sidewall of the first insulating interlayer in the first opening. A first bonding insulating layer structure is formed on the first conductive pattern structure and the first insulating interlayer and planarized to expose a top surface of the first conductive pattern structure.

The methods further include forming a second opening in a second insulating interlayer on a second substrate, forming a second barrier layer in the first opening and on portions of the second insulating interlayer adjacent the second opening, and forming a second conductive layer on the second barrier layer. The second conductive layer and the second barrier layer are chemical mechanical polished to expose a top surface of the second insulating interlayer and form a second conductive pattern structure having a second barrier layer pattern and a second conductive pattern on the second barrier layer pattern. The second conductive pattern has a top surface higher than a top surface of a portion of the second barrier layer pattern on a sidewall of the second insulating interlayer in the second opening. A second bonding insulating layer structure is formed on the second conductive pattern structure and the second insulating interlayer and planarized to expose a top surface of the second conductive pattern structure. The first and second substrates are bonded together with the first and second conductive pattern structures in contact with each other.

In some embodiments, chemical mechanical polishing the first conductive layer and the first barrier layer leaves the top surface of the first barrier layer on the side wall of the first opening substantially coplanar with the top surface of the first insulating interlayer, and chemical mechanical polishing the second conductive layer and the second barrier layer leaves the top surface of the second barrier layer on the side wall of the second opening substantially coplanar with the top surface of the second insulating interlayer. In further embodiments, chemical mechanical polishing the first conductive layer and the first barrier layer leaves the top surface of the first barrier layer on the side wall of the first opening lower than the top surface of the first insulating interlayer, and chemical mechanical polishing the second conductive layer and the second barrier layer leaves the top surface of the second barrier layer on the side wall of the second opening lower than the top surface of the second insulating interlayer.

In some embodiments, a third insulating interlayer between the first substrate and the first insulating interlayer may be further formed. The third insulating interlayer may contain a third conductive pattern structure therein. The first opening exposes a top surface of the third conductive pattern structure.

In some embodiments, a first etch stop layer between the third insulating interlayer and the first insulating interlayer may be further formed. The first etch stop layer may include silicon nitride, silicon carbonitride, silicon carbide, and/or silicon oxynitride. When the first opening is formed, portions of the first insulating interlayer and the first etch stop layer may be removed to expose the top surface of the third conductive pattern structure.

In still further embodiments, methods may include performing a plasma treatment on at least one of the first and second substrates having the first and second conductive pattern structures thereon prior to bonding the first and second substrates together. The plasma treatment may use, for example, a nitrogen plasma, an oxygen plasma, a hydrogen plasma, a mixed plasma including nitrogen and hydrogen, a tetrafluoromethane ($CF_4$) plasma, and/or an ammonia plasma.

In some embodiments, planarizing the first bonding insulating layer structure to expose a top surface of the first conductive pattern structure may include chemical mechanical polishing the first bonding insulating layer structure. Planarizing the second bonding insulating layer structure to expose a top surface of the second conductive pattern structure may include chemical mechanical polishing the second bonding insulating layer structure.

In some embodiments, the first bonding insulating layer structure may include at least two bonding insulating layers comprising different materials and the second bonding insulating layer structure may include at least two bonding insulating layers comprising different materials. In some embodiments, at least one of the bonding insulating layers in each of the first and second bonding insulating layer structures may include silicon carbonitride and at least one of the bonding insulating layers in each of the first and second bonding insulating layer structures may include silicon nitride.

Further embodiments provide methods of manufacturing a semiconductor device. A third insulating interlayer is formed on a first substrate. The third insulating interlayer contains a third conductive pattern structure therein. A first etch stop layer and a first insulating interlayer are sequentially formed on the third insulating interlayer to cover the third conductive pattern structure. A first opening is formed through the first insulating interlayer and the first etch stop layer to expose a top surface of the third conductive pattern structure. A first barrier layer is formed on the exposed top surface of the third conductive pattern structure, a sidewall of the first opening, and the first insulating interlayer. A first conductive layer is formed on the first barrier layer to fill a remaining portion of the first opening. A CMP process is performed on the first conductive layer and the first barrier layer until a top surface of the first insulating interlayer is exposed to form a first conductive pattern structure having a first barrier layer pattern and a first conductive pattern. The first conductive pattern has a top surface higher than a top surface of the first barrier layer pattern. A first bonding insulating layer structure is formed on the first conductive pattern structure and the first insulating interlayer. The first bonding insulating layer structure is planarized until a top surface of the first conductive pattern structure is exposed. A fourth insulating interlayer is formed on a second substrate. The fourth insulating interlayer contains a fourth conductive pattern structure therein. A second etch stop layer and a second insulating interlayer are sequentially formed on the fourth insulating interlayer to cover the fourth conductive pattern structure. A second opening is formed through the second insulating interlayer and the second etch stop layer to expose a top surface of the fourth conductive pattern structure. A second barrier layer is formed on the exposed top surface of the fourth conductive pattern structure, a sidewall of the second opening, and the second insulating interlayer. A second conductive layer is formed on the second barrier layer to fill a remaining portion of the second opening. A CMP process is performed on the second conductive layer and the second barrier layer until a top surface of the second insulating interlayer is exposed to form a second conductive pattern structure having a second barrier layer pattern and a second conductive pattern. The second conductive pattern has a top surface higher than a top surface of the second barrier layer pattern. A second bonding insulating layer structure is formed on the second conductive pattern structure and the second insulating interlayer. The second bonding insulating layer structure is planarized until a top surface of the second conductive pattern structure is exposed. A plasma treatment is performed on at least one of the first and second substrates having the first and second conductive pattern structures thereon, respectively. The first and second substrates are bonded with each other so that the first and second conductive pattern structures contact with each other.

In example embodiments, when the CMP process is performed on the first conductive layer and the first barrier layer, a top surface of the first barrier layer pattern may be substantially coplanar with the top surface of the first insulating interlayer. When the CMP process is performed on the second conductive layer and the second barrier layer, a top surface of the second barrier layer pattern may be substantially coplanar with the top surface of the second insulating interlayer.

In example embodiments, when the CMP process is performed on the first conductive layer and the first barrier layer, a top surface of the first barrier layer pattern may be lower than the top surface of the first insulating interlayer. When the CMP process is performed on the second conductive layer and the second barrier layer, a top surface of the second barrier layer pattern may be lower than the top surface of the second insulating interlayer.

In example embodiments, the first bonding insulating layer structure may include a third bonding insulating layer and a first bonding insulating layer. The third bonding insulating layer and the first bonding insulating layer may include different materials from each other, and may be stacked sequentially. The second bonding insulating layer structure may include a fourth bonding insulating layer and a second bonding insulating layer. The fourth bonding insulating layer and the second bonding insulating layer may include different materials from each other, and may be stacked sequentially.

In example embodiments, when the first bonding insulating layer structure is planarized until a top surface of the first conductive pattern structure is exposed, a CMP process may be performed on the first bonding insulating layer. When the second bonding insulating layer structure is planarized until a top surface of the second conductive pattern structure is exposed, a CMP process may be performed on the second bonding insulating layer.

In methods according to further embodiments, a first insulating layer is formed on a substrate. An opening is formed in the first insulating layer. A barrier layer is formed on the first insulating layer and conforming to sidewalls of the first insulating layer in the opening. A conductive layer is formed on the barrier layer. Chemical mechanical polishing is performed to expose the first insulating layer and leave a barrier layer pattern in the opening and a conductive layer pattern on the barrier layer pattern in the opening, wherein a portion of the conductive layer pattern protrudes above an upper surface of the insulating layer and an upper surface of the barrier layer pattern. A second insulating layer is formed on the first insulating layer, the barrier layer pattern and the conductive layer pattern. The second insulating layer is planarized to expose the conductive layer pattern.

In some embodiments, the substrate may be a first substrate and the methods may further include bonding a second substrate to the exposed conductive layer pattern. Bonding the second substrate to the exposed conductive layer pattern may include bonding a conductive region of the second substrate to the exposed conductive layer pattern. Bonding the second substrate to the exposed conductive layer pattern may be preceded by plasma treating the exposed conductive layer pattern and adjacent portions of the second insulating layer. According to further embodiments, forming the opening in the first insulating layer may expose a conductive region, and the barrier layer pattern may conform to an upper surface of the conductive region.

According to example embodiments, there are provided methods of manufacturing a semiconductor device. A plurality of first transistors is formed on a first substrate. A first insulating interlayer is formed on the first substrate to cover the first transistors. A first conductive pattern structure partially contained by the first insulating interlayer and having a first conductive pattern and a first barrier layer pattern is formed. The first conductive pattern protrudes upwardly from a top surface of the first insulating interlayer. The first barrier pattern partially covers the first conductive pattern, and has a top surface lower than a top surface of the first conductive pattern. A first bonding insulating layer structure is formed on the first insulating interlayer and the first barrier layer pattern. The first bonding insulating layer covers an upper sidewall of the first conductive pattern protruding from the top surface of the first insulating interlayer. A photodiode is formed in a second substrate. A plurality of second transistors is formed on the second substrate. A second insulating interlayer is formed on the second substrate to cover the second transistors. A second conductive pattern structure partially contained by the first insulating interlayer and having a first conductive pattern and a first barrier layer pattern is formed. The first conductive pattern protrudes upwardly from a top surface of the first insulating interlayer. The first barrier pattern partially covers the first conductive pattern, and has a top surface lower than a top surface of the first conductive pattern. A second bonding insulating layer structure is formed on the second insulating interlayer and the second barrier layer pattern. The second bonding insulating layer covers an upper sidewall of the second conductive pattern protruding from the top surface of the second insulating interlayer. A plasma treatment is performed on at least one of the first and second substrates having the first and second conductive pattern structures thereon, respectively. The first and second substrates are bonded with each other so that the first and second conductive pattern structures contact with each other. An anti-reflective layer and a third insulating interlayer are formed on the second substrate sequentially. A shielding layer pattern partially contained by the third insulating interlayer is formed. A waveguide is formed in the third insulating interlayer. The waveguide overlaps the photodiode. A color filter and a lens are formed on the waveguide sequentially.

In methods in accordance with some example embodiments, when the insulating interlayers containing the conductive patterns therein are bonded with each other, the height difference thereof may be enhanced and the portion generating defects may be removed so that the interface may be even and smooth. Thus, the semiconductor device may have good electrical reliability.

BRIEF DESCRIPTION OF THE DRAWINGS

Example embodiments will be more clearly understood from the following detailed description taken in conjunction with the accompanying drawings. FIGS. 1 to 29 represent non-limiting, example embodiments as described herein.

FIGS. 1 to 8 are cross-sectional views illustrating operations for manufacturing a semiconductor device in accordance with some example embodiments;

FIG. 9 is a cross-sectional view illustrating operations for manufacturing a semiconductor device in which first and second conductive pattern structures of structures illustrated in FIG. 8 are bonded in a misaligned manner;

FIGS. 10 to 14 are cross-sectional views illustrating operations for manufacturing a semiconductor device in accordance with further example embodiments;

FIG. 15 is a cross-sectional view illustrating operations for manufacturing a semiconductor device in which first and second conductive pattern structures shown in FIG. 14 are bonded in a misaligned manner;

FIGS. 16 to 17 are cross-sectional views illustrating operations for manufacturing a semiconductor device in accordance with additional example embodiments; and FIGS. 18 to 29 are cross-sectional views illustrating operations for manufacturing a semiconductor device in accordance with further example embodiments.

DESCRIPTION OF EMBODIMENTS

Figure 1:
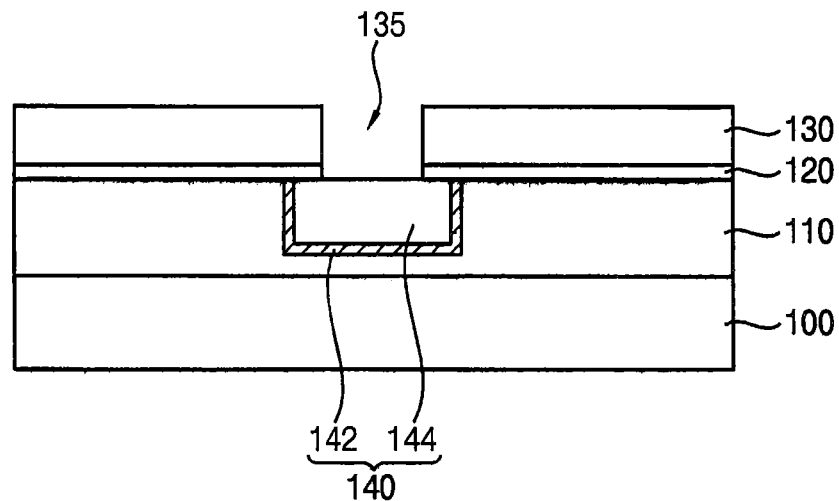

Various example embodiments will be described more fully hereinafter with reference to the accompanying drawings, in which some example embodiments are shown. The present inventive concept may, however, be embodied in many different forms and should not be construed as limited to the example embodiments set fourth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 7:
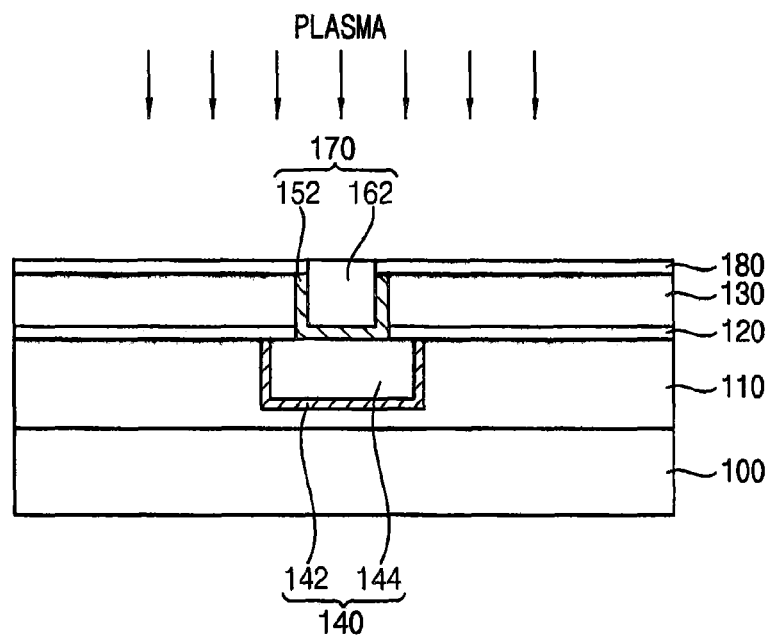
Figure 8:
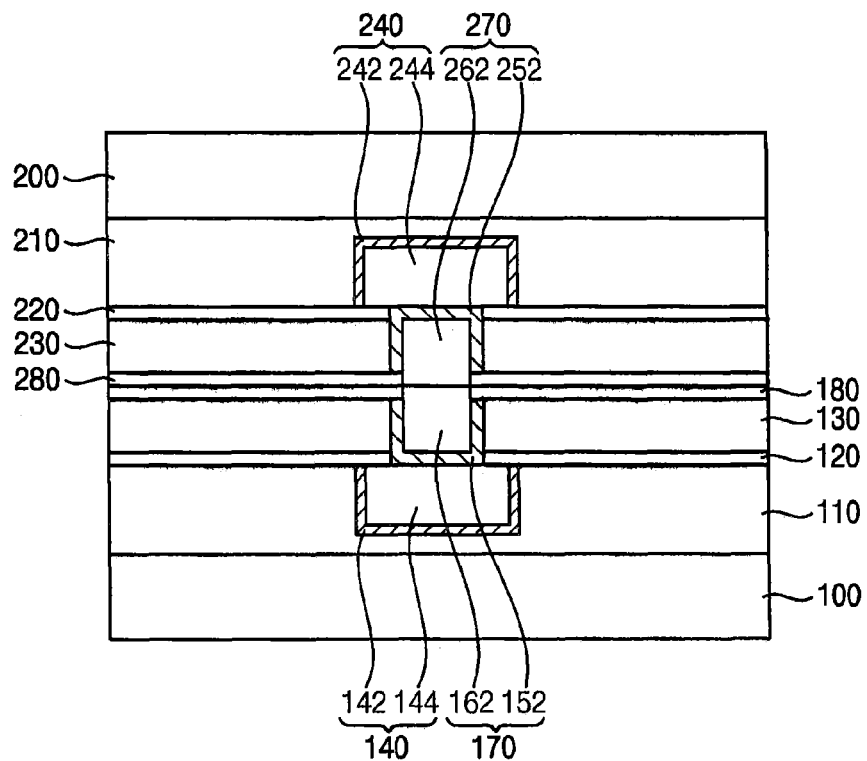
Figure 9:
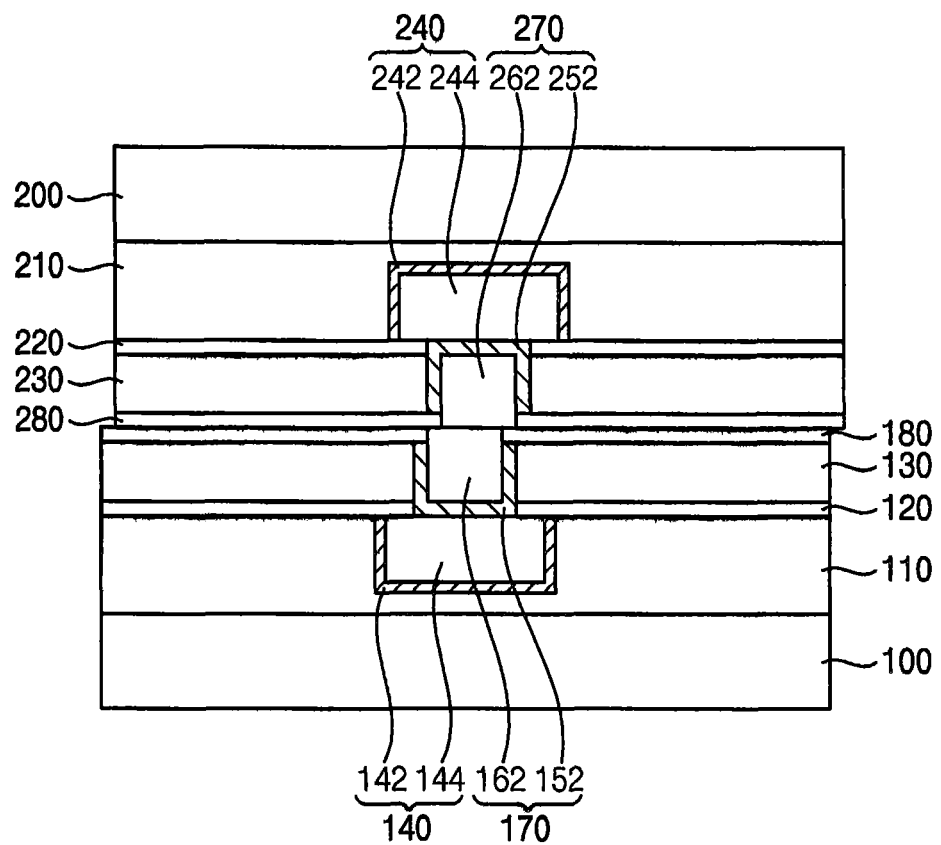

FIGS. 1 to 8 are cross-sectional views illustrating operations for manufacturing a semiconductor device in accordance with example embodiments. FIG. 9 is a cross-sectional view illustrating a method of manufacturing a semiconductor device in which first and second conductive pattern structures of FIG. 8 are bonded to in a misaligned matter.

Referring to FIG. 1, a third insulating interlayer 110 containing a third conductive pattern structure 140 therein may be formed on a first substrate 100. A first etch stop layer 120 and a first insulating interlayer 130 may be sequentially formed on the third insulating interlayer 110 and the third conductive pattern structure 140. A first opening 135 may be formed through the first insulating interlayer 130 and the first etch stop layer 140 to expose a top surface of the third conductive pattern structure 140.

The first substrate 100 may include a semiconductor material, e.g., silicon, germanium, and/or silicon-germanium. In some embodiments, the first substrate 100 may include a compound semiconductor, e.g., silicon carbide, gallium arsenide, gallium phosphate, indium phosphate, indium arsenide, and/or indium antimonide, or glass. The third insulating interlayer 110 may be formed of a nitride, e.g., silicon nitride, or a low-k dielectric material.

In some example embodiments, a recess (not shown) may be formed in the third insulating interlayer 110. A third barrier layer may be formed on an inner wall of the recess and the third insulating interlayer 110. A third conductive layer may be formed on the third barrier layer to fill the recess. The third conductive layer and the third barrier layer may be planarized until a top surface of the third insulating interlayer 110 may be exposed. Thus, the third conductive pattern structure 140 including a third barrier layer pattern 142 on the inner wall of the recess, and a third conductive pattern 144 filling a remaining portion of the recess on the third barrier layer pattern 142 may be formed. A bottom and a sidewall of the third conductive pattern 144 may be covered by the third barrier layer pattern 142.

The third conductive layer may include a metal, e.g., copper, aluminum, tungsten, nickel, or the like. The third barrier layer may include a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten. The third conductive layer may be formed using, for example, an electroplating process or an electroless plating process.

The third conductive pattern 144 and the third barrier layer pattern 142 may have a single layer structure or a multi-layered structure. The first etch stop layer 120 may be formed of a nitride, e.g., silicon nitride, silicon carbonitride, silicon oxynitride, or the like, or a carbide, e.g., silicon carbide. In some embodiments, the first etch stop layer 120 may not be formed.

The first insulating interlayer 130 may be formed of an oxide, e.g., silicon oxide, or a low-k dielectric material. In example embodiments, the first insulating interlayer 130 may be formed of a material substantially the same as that of the third insulating interlayer 110.

The first opening 135 may be formed by etching the third insulating interlayer 130 and the first etch stop layer 120 to expose at least a top surface of the third conductive pattern 144 of the third conductive pattern structure 140.

Figure 2:
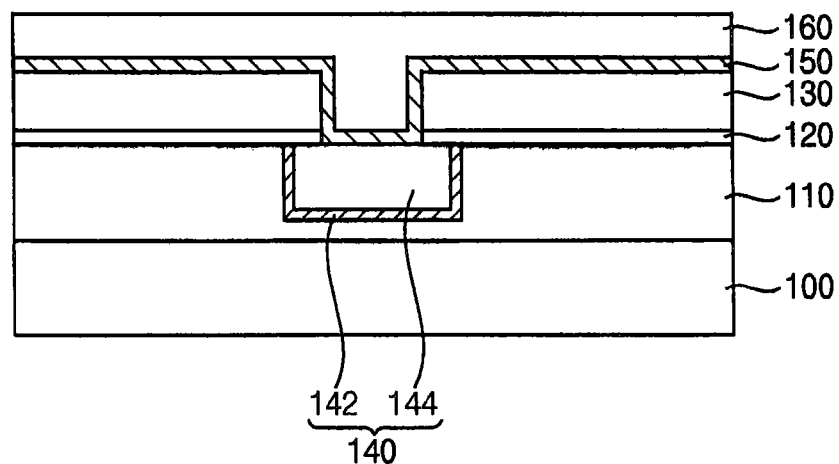

Referring to FIG. 2, a first barrier layer 150 may be formed on the exposed top surface of the third conductive pattern structure 140, a sidewall of the first opening 135 and the first insulating interlayer 130. A first conductive layer 160 may be formed on the first barrier layer 150 to fill the first opening 135.

The first barrier layer 150 may include a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, and/or a metal alloy, e.g., titanium tungsten. In some example embodiments, the first barrier layer 150 may include a material substantially the same as that of the third barrier layer 142.

In example embodiments, the first conductive layer 160 may include a material substantially the same as that of the third conductive layer 144. The first conductive layer 160 may include, for example, a metal, e.g., copper, aluminum, tungsten, nickel, or the like. The first conductive layer 160 may be formed using, for example, an electroplating process or an electroless plating process.

Figure 3:
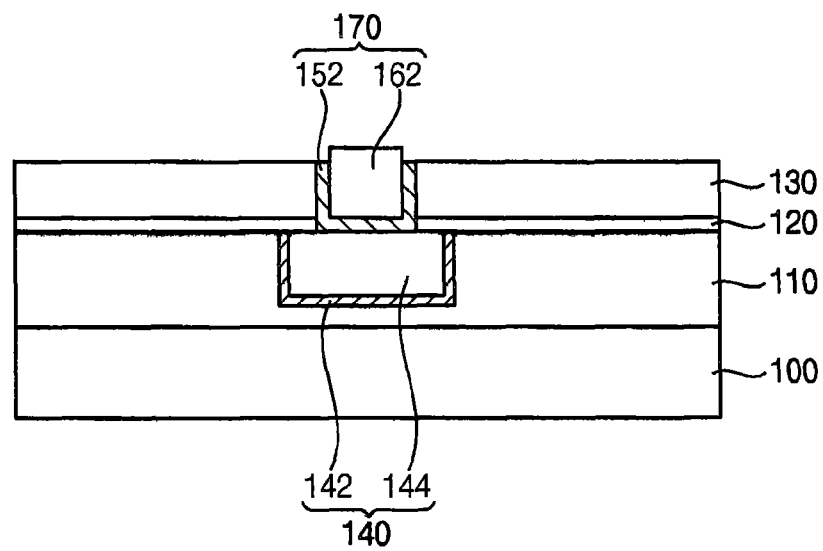

Referring to FIG. 3, the first conductive layer 160 and the first barrier layer 150 may be planarized until a top surface of the first insulating interlayer 130 may be exposed to form a first conductive pattern 162 and a first barrier layer pattern 152, respectively. The first conductive pattern 162 may be formed to have a top surface higher than a top surface of the first barrier layer pattern 152. The first conductive pattern 162 and the first barrier layer pattern 152 may collectively form a first conductive pattern structure 170. The planarization process may include, for example, a chemical mechanical polishing (CMP) process.

As a result of the CMP process, the top surface of the first barrier layer pattern 152 may be substantially coplanar with the top surface of the first insulating interlayer 130. The first conductive pattern 162 may protrude above the top surfaces of the first insulating interlayer 130 and the first barrier layer pattern 152.

Figure 4:
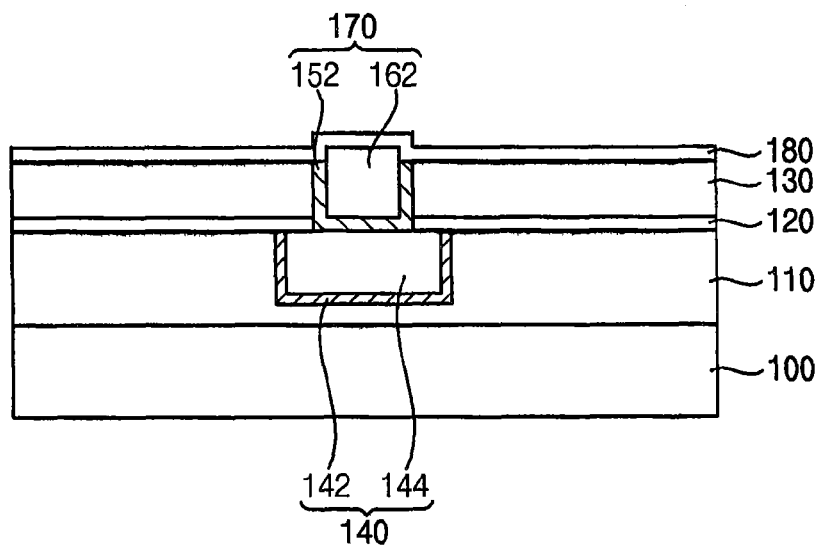

Referring to FIG. 4, a first bonding insulating layer structure 180 may be formed on the first conductive pattern structure 170 and the first insulating interlayer 130. The first bonding insulating layer structure 180 may include a nitride, e.g., silicon nitride, silicon carbonitride, silicon oxynitride, or the like, or a carbide, e.g., silicon carbide. The first bonding insulating layer structure 180 may be formed using, for example, a chemical vapor deposition (CVD) process, an atomic layer deposition (ALD) process, or a physical vapor deposition (PVD) process.

Referring to FIG. 5, the first bonding insulating layer structure 180 may be planarized until the top surface of the first conductive pattern 162 is exposed. The planarization process may include, for example, a CMP process. The metal-containing first conductive pattern 162 may be polished more quickly than the first bonding insulating layer structure 180. When the first conductive pattern 162 and the first bonding insulating layer structure 180 are polished simultaneously, dishing may cause more of the first conductive pattern 162 to be removed than the first bonding insulating layer structure 180. An upper surface of the first conductive pattern 162 may be lower than a top surface of the first bonding insulating layer structure 180. However, in some example embodiments, the polishing process may be performed only on the first bonding insulating layer structure 180, thus reducing or eliminating dishing.

When the first conductive pattern 162 and the first barrier layer pattern 152 are etched by a CMP process simultaneously, galvanic corrosion may occur in metal components of the first conductive pattern 162 and the first barrier layer pattern 152. In particular, when dissimilar metals come into contact with a corrosive electrolyte, a relatively more active metal may corrode at a greater rate due to an electro potential difference between the dissimilar metals. Thus, a level difference between top surfaces of the first conductive pattern 162 and the first barrier layer pattern 152 may occur.

However, in some example embodiments, the first conductive pattern 162 and the first barrier layer pattern 152 may not be simultaneously exposed to the corrosive electrolyte during the planarization process because the top surface of the first barrier layer pattern 152 may be covered by the first bonding insulating layer structure 180. Thus, the level difference between the first conductive pattern 162 and the first barrier layer pattern 152 due to the galvanic corrosion may not occur.

By the above processes, the third and first insulating interlayers 110 and 130 may be sequentially stacked on the first substrate 100, and the third and first conductive pattern structures 140 and 170 may be formed in the third and first insulating interlayers 110 and 130, respectively.

Referring to FIG. 6, processes substantially the same as or similar to those illustrated with reference to FIGS. 1 to 5 may be performed to form fourth and second insulating interlayers 210 and 230 sequentially stacked on a second substrate 200, and fourth and second conductive pattern structures 240 and 270 may be formed in the fourth and second insulating interlayers 210 and 230, respectively.

The second substrate 200 may include a material substantially the same as that of the first substrate 100. Each of the second and fourth insulating interlayers 230 and 210 may be formed of an oxide, e.g., silicon oxide, or a low-k dielectric material. In example embodiments, the second and fourth insulating interlayers 230 and 210 may be formed of materials substantially the same as those of the first and third insulating interlayers 130 and 110, respectively.

In some example embodiments, a second etch stop layer 220 may be further formed between the second insulating interlayer 230 and the fourth insulating interlayer 210 to include a nitride, e.g., silicon nitride, silicon carbonitride, silicon oxynitride, or the like, or a carbide, e.g., silicon carbide.

The second conductive pattern structure 270 may include a second conductive pattern 262 and a second barrier layer pattern 252. A sidewall and a bottom of the second conductive pattern 262 may be covered by the second barrier layer pattern 252. The fourth conductive pattern structure 240 may include a fourth conductive pattern 244 and a fourth barrier layer pattern 242. A sidewall and a bottom of the fourth conductive pattern 244 may be covered by the fourth barrier layer pattern 242.

The second and fourth conductive layer patterns 262 and 244 may include a metal, e.g., copper, aluminum, tungsten, nickel, or the like, a metal nitride, and/or a metal silicide. The second and fourth barrier layer patterns 252 and 242 may include a metal, e.g., titanium, tantalum, tungsten, ruthenium, cobalt, nickel, or the like, a metal nitride, e.g., titanium nitride, tantalum nitride, tungsten nitride, titanium zirconium nitride, titanium silicon nitride, tantalum aluminum nitride, tantalum silicon nitride, or the like, or a metal alloy, e.g., titanium tungsten. The second bonding insulating layer structure 280 may include a nitride, e.g., silicon nitride, silicon carbonitride, silicon oxynitride, or the like, or a carbide, e.g., silicon carbide, and may be formed by a planarization process, e.g., a CMP process.

As illustrated with reference to FIGS. 1 to 5, dishing of the second conductive pattern 262 may be prevented, and galvanic corrosion may not occur between the second conductive pattern 262 and the second barrier layer pattern 252.

Referring to FIG. 7, a plasma treatment may be performed on at least one of the first and second substrates 100 and 200 having the first and second conductive pattern structures 170 and 270 thereon, respectively. In some example embodiments, the plasma treatment may be performed using, for example, nitrogen plasma, oxygen plasma, hydrogen plasma, mixed plasma including nitrogen and hydrogen, tetrafluoromethane ($CF_4$) plasma, and/or ammonia plasma. The plasma treatment may be performed using a capacitively coupled plasma source or an inductively coupled plasma source.

Referring to FIG. 8, the first and second substrates 100 and 200 may be bonded so that the first and second conductive pattern structures 170 and 270 are in contact with one another. The first and second substrates 100 and 200 may be bonded at a high temperature. Hereinafter, a top surface of the second substrate 200 in FIG. 6 may be referred to as a bottom surface in FIG. 8, and a bottom surface of the second substrate 200 in FIG. 6 may be referred to as a top surface in FIG. 8.

When the first and second substrates 100 and 200 are bonded with each other so that the first and second conductive pattern structures 170 and 270 are aligned with each other, the first and second conductive patterns 162 and 262 may contact each other, and the first and second bonding insulating layer structures 180 and 280 may also contact each other. However, the first and second barrier layer patterns 152 and 252 may not be in contact with each other due to the first and second bonding insulating structures 180 and 280.

When the first and second substrates 100 and 200 are bonded, bonding surfaces include top surfaces of the first conductive pattern 162 and the first bonding insulating layer structure 180 formed on the first substrate 100, and bottom surfaces of the second conductive pattern 262 and the second bonding insulating layer structure 280 formed on the second substrate 200. As described above, little or no dishing may occur at the first and second conductive patterns 162 and 262, and little or no galvanic corrosion may occur at the first and second bonding insulating layer structures 180 and 280. Thus, an interface between the first and second substrates 100 and 200 may be relatively uniform, and a bonding force therebetween may be strong. Accordingly, a semiconductor device manufactured by the bonding of the first and second substrates 100 and 200 may have good electrical characteristics and good reliability. The second substrate 200 may be removed later, if needed.

In some embodiments, when the first and second substrates 100 and 200 are bonded together, the first and second conductive pattern structures 170 and 270 may be misaligned, which is illustrated in FIG. 9. When the first and second conductive pattern structures 170 and 270 are misaligned, the first conductive patterns 162 may contact the second conductive pattern 262 and the second bonding insulating layer structure 280, and the second conductive pattern 262 may contact the first conductive pattern 162 and the first bonding insulating layer structure 180. However, the first and second barrier layer patterns 152 and 252 may not contact with each other due to the first and second bonding insulating structures 180 and 280.

In the illustrated embodiments, an interface between the first and second substrates 100 and 200 may be even and smooth with no bumps therein, and a bonding force therebetween may be strong. Accordingly, the semiconductor device manufactured by the bonding of the first and second substrates 100 and 200 may have good electrical characteristics and good reliability.

Hereinafter, the semiconductor device manufactured by the method illustrated with reference to FIGS. 1 to 8 will be explained.

The semiconductor device may include the first insulating interlayer 130 on the first substrate 100, the first conductive pattern structure 170 including the first barrier layer pattern 152 and the first conductive pattern 162, the first bonding insulating layer structure 180, which may cover a sidewall of the protruding first conductive pattern 162 and may be formed on the first insulating interlayer 130 and the first barrier layer pattern 152, the second bonding insulating layer structure 280 on the first bonding insulating layer structure 180, the second insulating interlayer 230 on the second bonding insulating layer structure 280, and the second conductive pattern structure 270 including the second barrier layer pattern 252 and the second conductive pattern 262. The first barrier layer pattern 152 may be formed on a sidewall and a bottom of the first opening 135 penetrating the first insulating interlayer 130. A bottom surface and a portion of a sidewall of the first conductive pattern 162 may be covered by the first barrier layer pattern 152. The first conductive pattern 162 may protrude upwardly from a top surface of the first insulating interlayer 130. The second barrier layer pattern 252 may be formed on a sidewall and a top of the second opening 235 penetrating the second insulating interlayer 230, and may contact the second bonding insulating layer structure 280. A top surface and a portion of a sidewall of the second conductive pattern 262 may be covered by the second barrier layer pattern 252. The second conductive pattern 262 may protrude downwardly from a bottom surface of the second insulating interlayer 230, and may contact the first conductive pattern 162.

The first barrier layer pattern 152 may be contained by the first insulating interlayer 130, and may contain a portion of the first conductive pattern 162 therein. A top surface of the first barrier layer pattern 152 may contact the first bonding insulating layer structure 180.

The second barrier layer pattern 252 may be contained by the second insulating interlayer 230, and may contain a portion of the second conductive pattern 262 therein. A bottom surface of the second barrier layer pattern 252 may contact the second bonding insulating layer structure 280.

In some example embodiments, the top surfaces of the first and second barrier layer patterns 152 and 252 may be substantially coplanar with the top surfaces of the first and second insulating interlayers 130 and 230, respectively.

The bottom surface and the portion of the sidewall of the first conductive pattern 162 may be covered by the first barrier layer pattern 152. The first conductive pattern 162 may protrude upwardly from the top surface of the first insulating interlayer 130. The protruding portion of the first conductive pattern 162 may be covered by the first bonding insulating layer structure 180, and may contact the second conductive pattern 262.

The top surface and the portion of the sidewall of the second conductive pattern 262 may be covered by the second barrier layer pattern 252. The second conductive pattern 262 may protrude downwardly from the bottom surface of the second insulating interlayer 130. The protruding portion of the second conductive pattern 262 may be covered by the second bonding insulating layer structure 280, and may contact the first conductive pattern 162.

The first and second conductive pattern structures 170 and 270 may contact with each other. The first and second conductive patterns 162 and 262 may contact with each other, while the first and second barrier layer patterns 152 and 252 may not contact with each other.

The first bonding insulating layer structure 180 may cover the sidewall of the first conductive pattern 162 protruding upwardly from the top surface of the first insulating interlayer 130, and may be formed on the first insulating interlayer 130 and the first barrier layer pattern 152. The top surface of the first bonding layer structure 180 may contact the second bonding insulating layer structure 280.

The second bonding insulating layer structure 280 may cover the sidewall of the second conductive pattern 262 protruding downwardly from the bottom surface of the second insulating interlayer 230, and may be formed beneath the second insulating interlayer 230 and the second barrier layer pattern 252. The bottom surface of the second bonding layer structure 280 may contact the first bonding insulating layer structure 180.

In some example embodiments, the first bonding insulating layer structure 180 may include a material substantially the same as that of the second bonding insulating layer structure 280. In some embodiments, the first and second bonding insulating layer structures 180 and 280 may be merged.

In some example embodiments, the semiconductor device may further include the third insulating interlayer 110 disposed between the first substrate 100 and the first insulating interlayer 130, the third conductive pattern structure 140, which may be in the third insulating interlayer 110 and may contact a bottom surface of the first conductive pattern structure 170, the fourth insulating interlayer 210 disposed on the second insulating interlayer 220, the fourth conductive pattern structure 240, which may be in the fourth insulating interlayer 210 and may contact a top surface of the second conductive pattern structure 270.

The third conductive pattern structure 140 may include the third conductive pattern 144 and the third barrier layer pattern 142. The third barrier layer pattern 142 may cover a sidewall and a bottom surface of the third conductive pattern 144. The fourth conductive pattern structure 240 may include the fourth conductive pattern 244 and the fourth barrier layer pattern 242. The fourth barrier layer pattern 242 may cover a sidewall and a top surface of the fourth conductive pattern 244. The third conductive pattern structure 140 may be electrically connected to the first substrate 100 by a contact plug (not shown), and the fourth conductive pattern structure 240 may be electrically connected to the second substrate 200 by a contact plug (not shown).

The semiconductor device may further include the first etch stop layer 120. The first etch stop layer 120 may be formed between the first and third insulating interlayers 130 and 110, and may cover a lower portion of a sidewall of the first conductive pattern structure 140. The semiconductor device may further include the second etch stop layer 220. The second etch stop layer 220 may be formed between the second and fourth insulating interlayers 230 and 210, and may cover an upper portion of a sidewall of the second conductive pattern structure 240.

The semiconductor device illustrated in FIG. 9 may include the first and second conductive pattern structures 170 and 270 that may be misaligned. The first conductive pattern 162 may contact the second conductive pattern 262 and the second bonding insulating layer structure 280, and the second conductive pattern 262 may contact the first conductive pattern 162 and the first bonding insulating layer structure 180.

Figure 12:
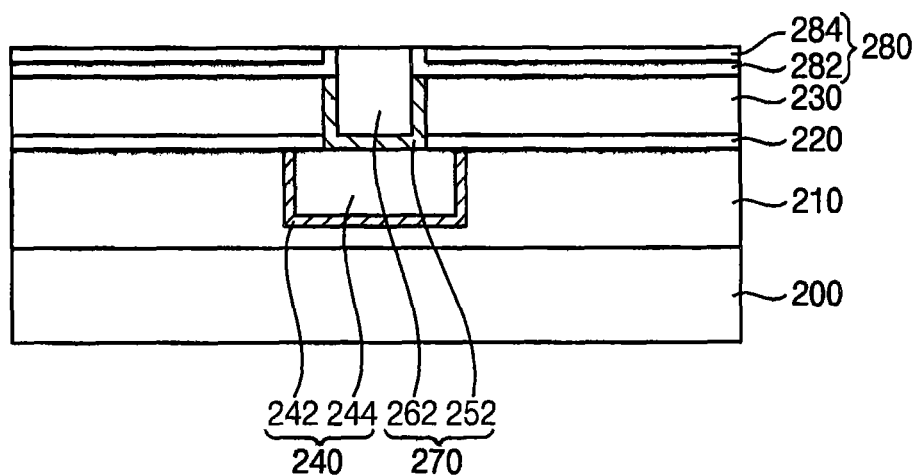
Figure 13:
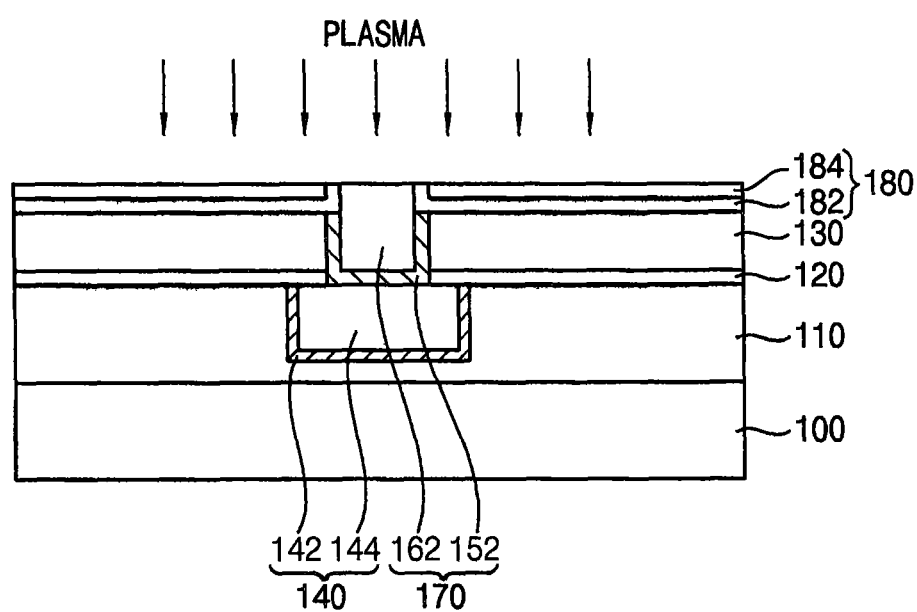
Figure 14:
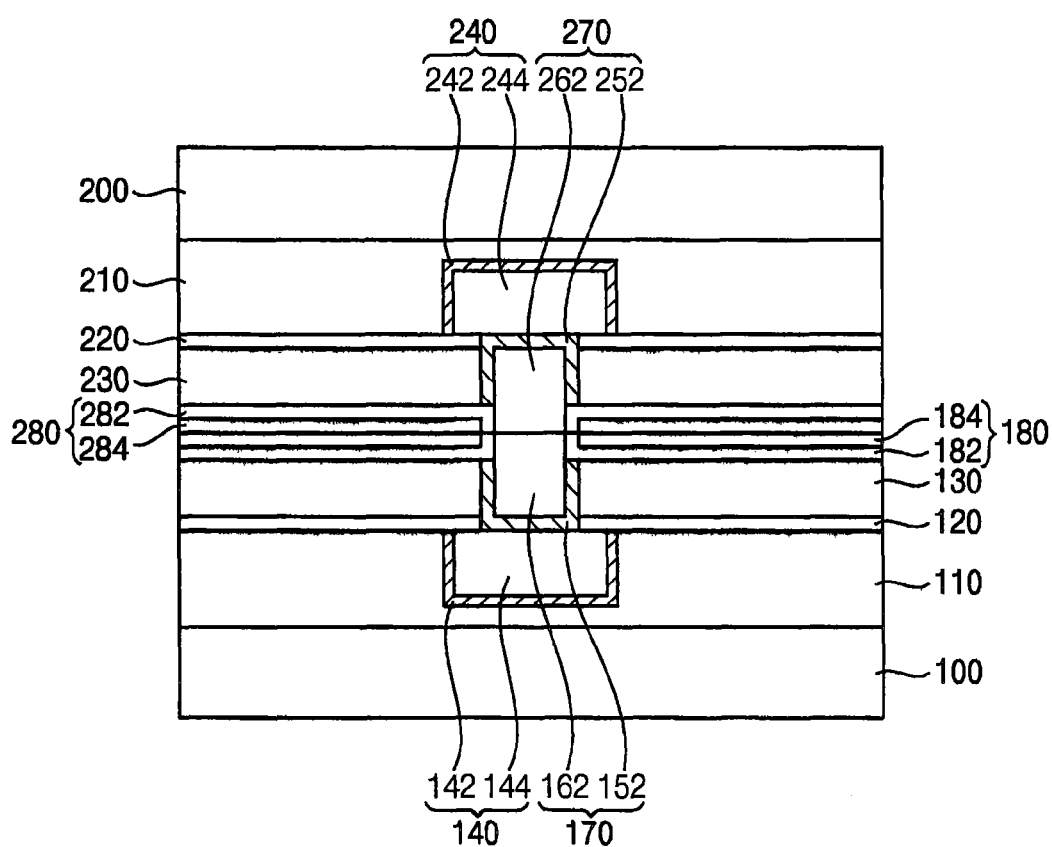
Figure 15:
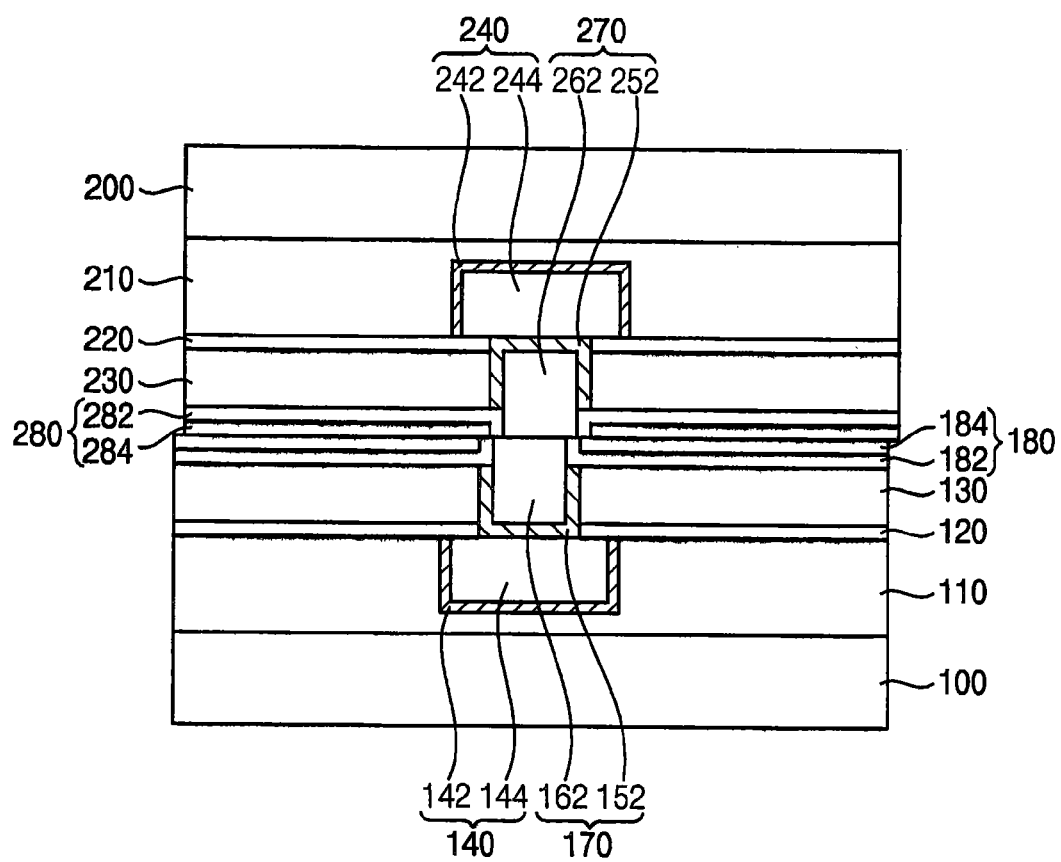

FIGS. 10 to 14 are cross-sectional views illustrating operations for manufacturing a semiconductor device in accordance with further example embodiments. FIG. 15 is a cross-sectional view illustrating operations for manufacturing a semiconductor device in which first and second conductive pattern structures of FIG. 14 are bonded in a misaligned manner. These operations may be substantially the same as or similar to those illustrated with reference to FIGS. 1 to 9, except that the bonding insulating layer structure may include two different bonding insulating layers. Thus, like reference numerals refer to like elements, and repeated descriptions of such like elements may be omitted below in light of the foregoing description.

Figure 10:
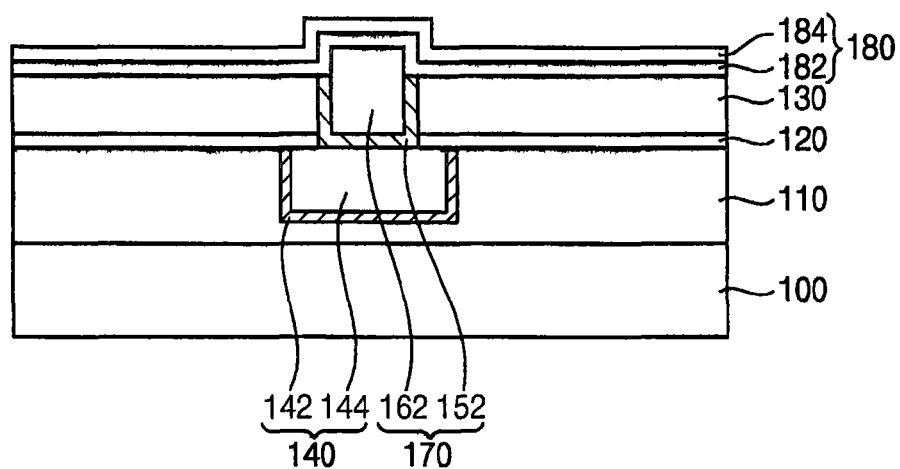

Process substantially the same as or similar to those illustrated with reference to FIGS. 1 to 3 may be performed. Referring to FIG. 10 now, a first bonding insulating layer structure 180 may be formed on the first conductive pattern structure 170 and the first insulating interlayer 130.

In example embodiments, the first bonding insulating layer structure 180 may include a third bonding insulating layer 182 and a first bonding insulating layer 184 on the third bonding insulating layer 182. The third bonding insulating layer 182 and the first bonding insulating layer 184 may include different materials. For example, the third bonding insulating layer 182 may be formed of silicon nitride and the first bonding insulating layer 184 may be formed of silicon carbonitride.

Figure 11:
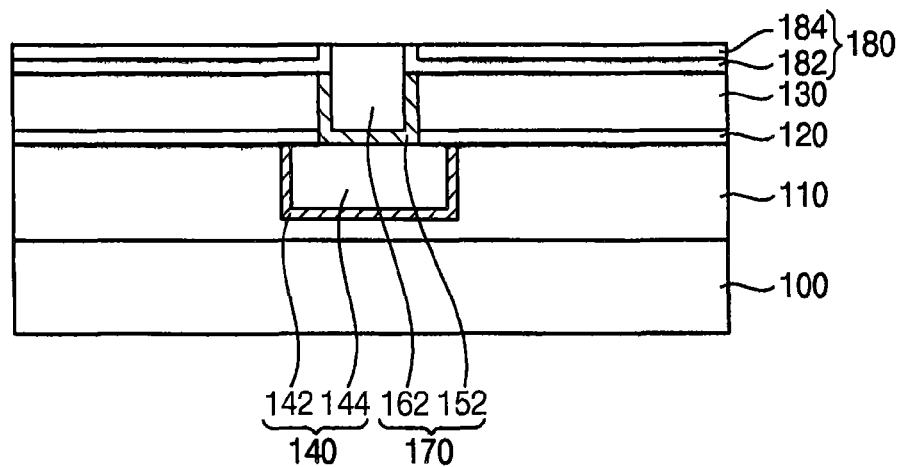

Referring to FIG. 11, the first bonding insulating layer structure 180 may be planarized until a top surface of a first conductive pattern 162 is exposed. The planarization process may include, for example, a CMP process.

A portion of the third bonding insulating layer 182 covering the first conductive pattern 162 may be exposed, and the first bonding insulating layer 184 may be spaced apart from the first conductive pattern 162 by the third bonding insulating layer 182.

Only the first bonding insulating layer 180 may be polished during the planarization process, thus reducing or eliminating dishing at the first conductive pattern 162. A top surface of the a first barrier layer pattern 152 may be covered with the first bonding insulating structure 180, and thus the first conductive pattern 162 and the first barrier layer pattern 152 may not be simultaneously exposed to a corrosive electrolyte during the planarization process. Thus, a height difference between the first conductive pattern 162 and the first barrier layer pattern 152 may be reduced or eliminated.

By the above processes, the third and first insulating interlayers 110 and 130, the third conductive pattern structure 140, and the first conductive pattern structure 170 may be formed. The third and first conductive pattern structures 140 and 170 may be contained by the third and first insulating interlayers 110 and 130, respectively.

Referring to FIG. 12, fourth and second insulating interlayers 210 and 230 may be sequentially stacked on a second substrate 200, and fourth and second conductive pattern structures 240 and 270 may be formed using processes substantially the same as or similar to those described above with reference to FIGS. 1 to 3 and FIGS. 10 and 11. The fourth and second conductive pattern structures 140 and 170 may be contained by the fourth and second insulating interlayers 210 and 230, respectively.

In some example embodiments, a second bonding insulating layer structure 280 may be formed, including a fourth bonding insulating layer 282 and a second bonding insulating layer 284. The fourth bonding insulating layer 282 and the second bonding insulating layer 284 may include different materials. For example, the fourth bonding insulating layer 282 may be formed of silicon nitride and the second bonding insulating layer 284 may be formed of silicon carbonitride.

As illustrated with reference to FIG. 11, dishing of the second conductive pattern 262 may be prevented, and a height difference due to galvanic corrosion may not occur between the second conductive pattern 262 and the second barrier layer pattern 252.

Referring to FIG. 13, a plasma treatment may be performed on at least one of the first and second substrates 100 and 200 having the first and second conductive pattern structures 170 and 270 thereon, respectively.

Referring to FIG. 14, the first and second substrates 100 and 200 may be bonded so that the first and second conductive pattern structures 170 and 270 may contact with each other.

In some embodiments, when the first and second substrates 100 and 200 are bonded together, the first and second conductive pattern structures 170 and 270 may be misaligned, which is illustrated in FIG. 15. Referring to FIG. 15, when the first and second conductive pattern structures 170 and 270 are misaligned, the first conductive patterns 162 may contact the second conductive pattern 262 and the second bonding insulating layer structure 280, and the second conductive pattern 262 may contact the first conductive pattern 162 and the first bonding insulating layer structure 180. However, the first and second barrier layer patterns 152 and 252 may not contact with each other due to the first and second bonding insulating structures 180 and 280.

Figure 16:
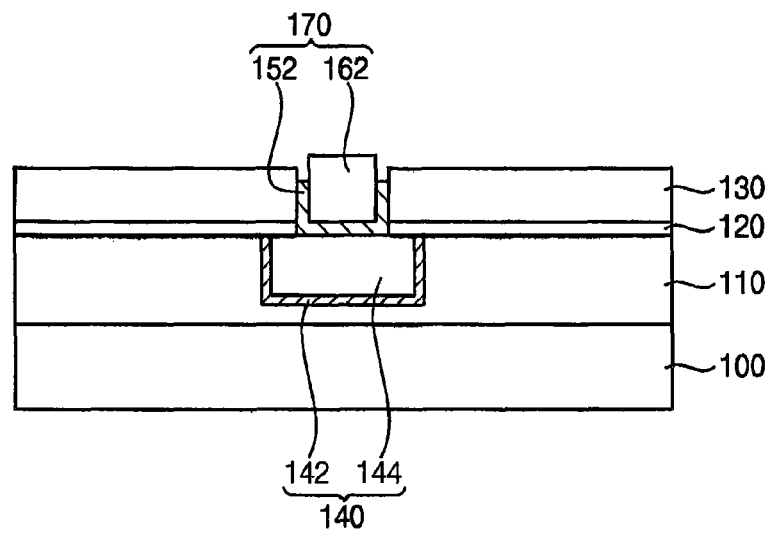
Figure 17:
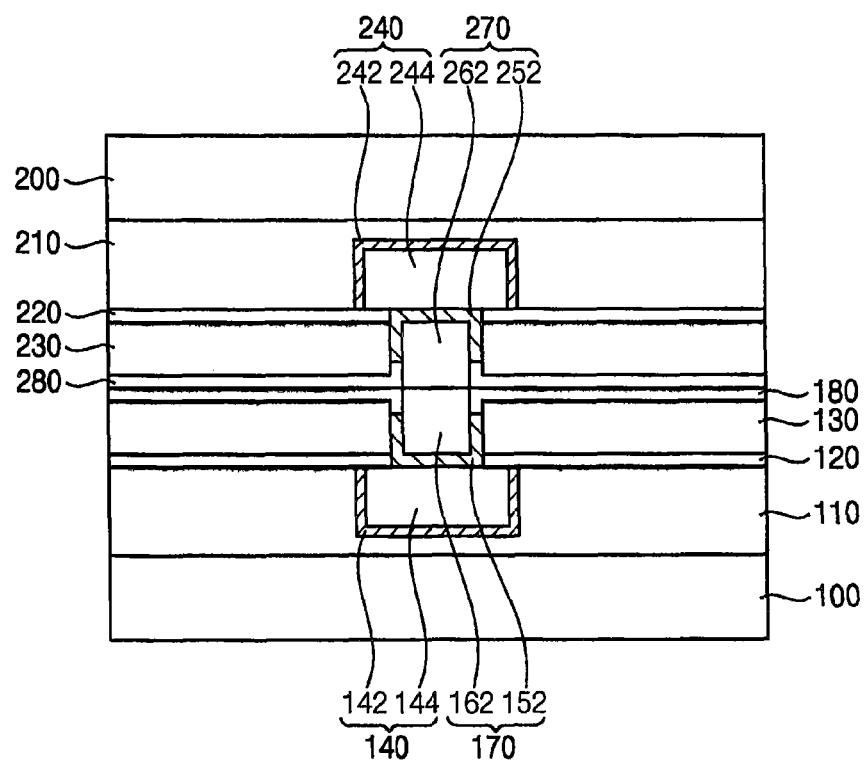

FIGS. 16 and 17 are cross-sectional views illustrating operations for manufacturing a semiconductor device in accordance with further example embodiments. These operations a be substantially the same as or similar to those described above with reference to FIGS. 1 to 9, except that a top surface of the barrier layer pattern may be lower than that of the insulating interlayer. Like reference numerals refer to like elements, and detailed descriptions thereon may be omitted below in light of the foregoing description of these elements.

Processes substantially the same as or similar to those illustrated with reference to FIGS. 1 and 2 may be performed. Referring to FIG. 16, the first conductive layer 160 and the first barrier layer 150 may be planarized until a top surface of the first insulating interlayer 130 is be exposed, thus forming a first conductive pattern 162 and a first barrier layer pattern 152. The planarization process may include, for example, a CMP process.

As the top surface of the first insulating interlayer 130 may be exposed during the planarization process, a top surface of the first barrier layer 150 may be also exposed, and a portion of the first barrier layer 150 may be removed by the CMP process. Accordingly, the first conductive pattern 162 may have a top surface higher than that of the first insulating interlayer 130, while the first barrier layer pattern 152 may have a top surface lower than that of the first insulating interlayer 130. The first conductive pattern 162 and the first barrier layer pattern 152 may form a first conductive pattern structure 170.

Referring to FIG. 17, processes substantially the same as or similar to those described above with reference to FIGS. 4 to 7 may be performed, and the first and second substrates 100 and 200 may be bonded so that the first conductive pattern structure 170 and the second conductive pattern structure 270 RN contact with one another. A bottom surface of the first bonding insulating layer 180 contacting a top surface of the first barrier layer pattern 152 may be lower than the top surface of the first insulating interlayer 130, and a top surface of a second bonding insulating layer 280 contacting a bottom surface of the second barrier layer pattern 252 may be higher than a bottom surface of the second insulating interlayer 230. In some embodiments, when the first and second substrates 100 and 200 are bonded together, the first and second conductive pattern structures 170 and 270 may be misaligned.

FIGS. 18 to 29 are cross-sectional views illustrating operations for manufacturing a semiconductor device, such as a solid-state image sensor, in accordance with some example embodiments.

Figure 18:
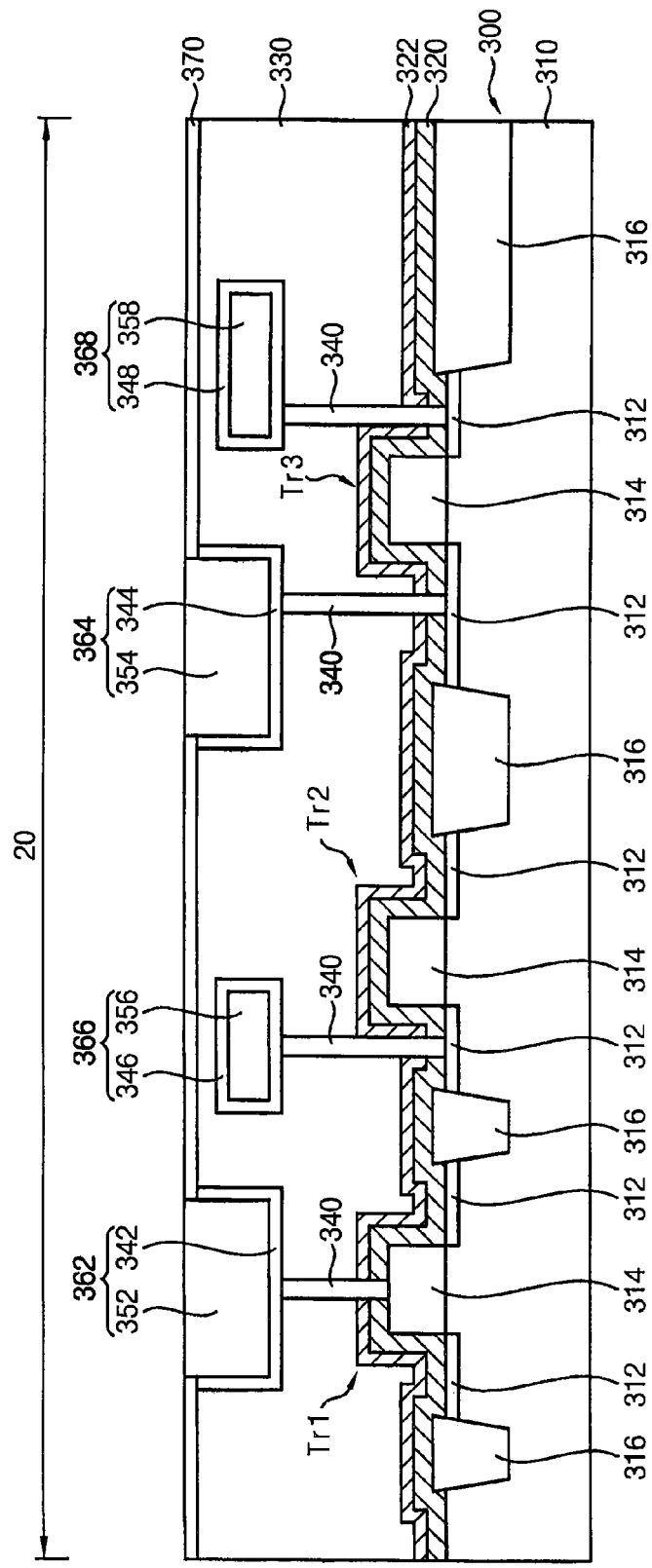

Referring to FIG. 18, a first gate structure 314 may be formed on a first substrate 300 having a first isolation layer 316 thereon.

A first well region 310 may be formed in the first substrate 300. For example, the first well region 310 may be formed by implanting p-type impurities into the first substrate 300.

A first source/drain region 312 may be formed at an upper portion of the first substrate 300 adjacent to the first gate structure 314. For example, the first source/drain region 312 may be formed by implanting n-type impurities into the first substrate 300.

The first gate structure 314 and the first source/drain region 312 may form a transistor. In some example embodiments, a plurality of transistors, for example, first to third transistors Tr1, Tr2, and Tr3 may be formed on the first substrate 300. The first to third transistors Tr1, Tr2, and Tr3 may be formed in a logic area 20.

First and second insulating films 320 and 322 may be sequentially formed on the first substrate 300 to cover the first to third transistors Tr1, Tr2, and Tr3. The first insulating film 320 may include, for example, silicon oxide, and the second insulating film 322 may include, for example, silicon nitride.

A first insulating interlayer 330 having a first contact plug 340 therein may be formed on the second insulating film 322. The first contact plug 340 may contact the first source/drain region 312, thereby being electrically connected to the first to third transistors Tr1, Tr2, and Tr3. The first contact plug 340 may include, for example, doped polysilicon, a metal, and/or a metal nitride.

Fifth and sixth conductive pattern structures 366 and 368 contacting the first contact plug 340 may be formed in the first insulating interlayer 330. In some example embodiments, the fifth conductive pattern structure 366 may include a fifth conductive pattern 356 and a fifth barrier layer pattern 346, and the sixth conductive pattern structure 368 may include a sixth conductive pattern 358 and a sixth barrier layer pattern 348. The fifth barrier layer pattern 346 may cover the fifth conductive pattern 356, and the sixth barrier layer pattern 348 may cover the sixth conductive pattern 358.

Processes substantially the same as or similar to those described above with reference to FIGS. 1 to 5 may be performed, so that first and second conductive pattern structures 362 and 364 contacting the first contact plug 340, and a first bonding insulating layer structure 370 may be sequentially formed on the first insulating interlayer 330. In some example embodiments, the first conductive pattern structure 362 may include a first conductive pattern 352 and a first barrier layer pattern 342, and the second conductive pattern structure 364 may include a second conductive pattern 354 and a second barrier layer pattern 344. The first barrier layer pattern 342 may cover the first conductive pattern 352, and the second barrier layer pattern 344 may cover the second conductive pattern 354.

The first conductive pattern 352 may be formed by a CMP process to have a top surface higher than top surfaces of the first barrier layer pattern 342 and the first insulating interlayer 330. The second conductive pattern 354 may be formed by a CMP process to have a top surface higher than top surfaces of the second barrier layer pattern 344 and the first insulating interlayer 330.

Figure 19:
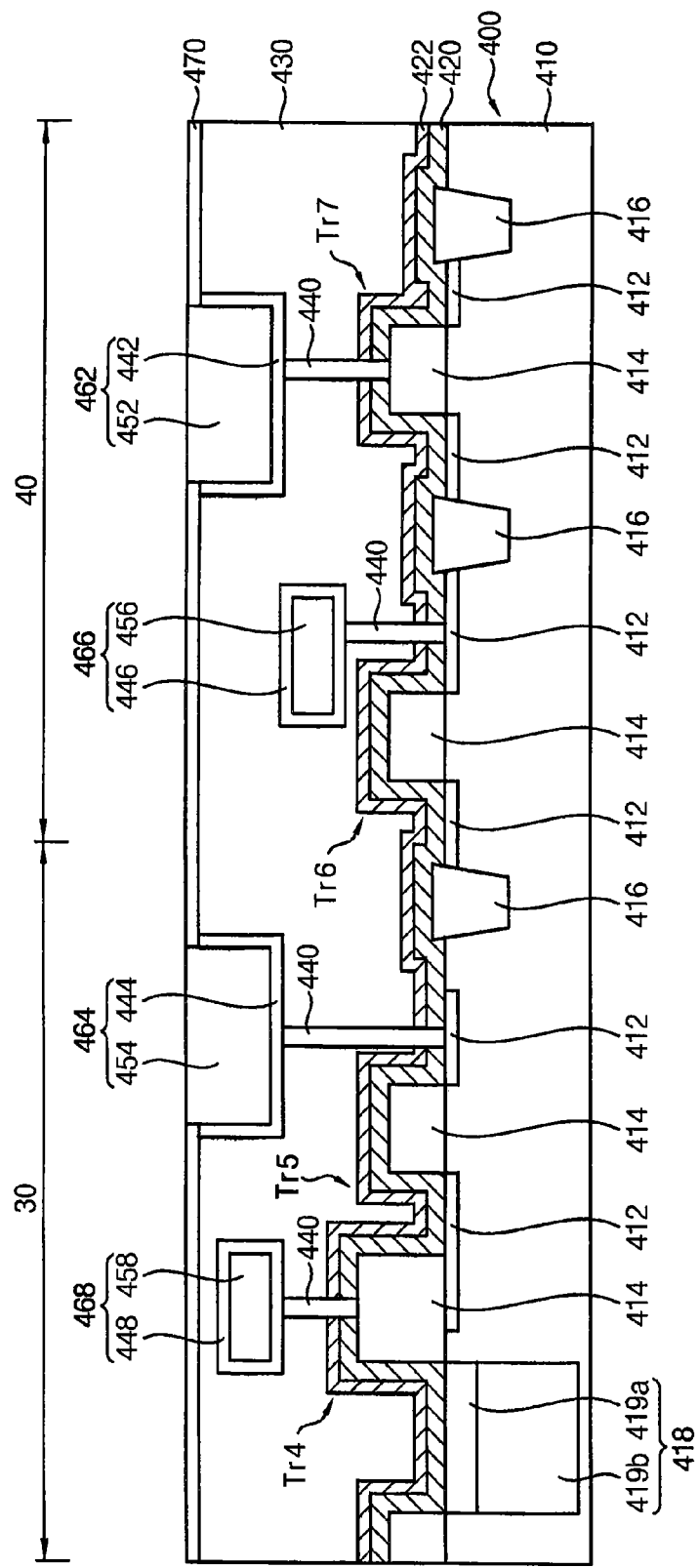

Referring to FIG. 19, a photodiode 418 may be formed in a second substrate 400 having a second isolation layer 416 thereon. The photodiode 418 may serve as a photoelectric conversion device for a pixel.

A second well region 410 may be formed in the second substrate 400. For example, the second well region 410 may be formed by implanting p-type impurities into the second substrate 300.

In some example embodiments, the photodiode 418 may include a second semiconductor region 419b on a first semiconductor region 419a. The first semiconductor region 419a may be formed by, for example, implanting p-type impurities into the second substrate 300. The second semiconductor region 419b may be formed by, for example, implanting n-type impurities into the second substrate 300.

Processes substantially the same as or similar to those described above with reference to FIG. 18 may be performed, so that a second gate structure 414 may be formed on the second substrate 400, and a second source/drain region 412 may be formed at an upper portion of the second substrate 400 adjacent to the second gate structure 414. Thus, a transistor defined by the second gate structure 414 and the second source/drain region 412 may be formed.

In some example embodiments, a plurality of transistors, e.g., fourth to seventh transistors Tr4, Tr5, Tr6, and Tr7, may be formed on the second substrate 400. The fourth and fifth transistors Tr4 and Tr5 may be formed in a pixel area 30, and the sixth and seventh transistors Tr6 and Tr7 may be formed in a control area 40. In some embodiments, the first to third transistors Tr1, Tr2, and Tr3 may be formed in the logic area 20 and the control area 40, and the fourth to seventh transistors Tr4, Tr5, Tr6, and Tr7 may be formed in the pixel area 30.

Third and fourth insulating films 420 and 422 may be sequentially formed on the second substrate 400 to cover the fourth to seventh transistors Tr4, Tr5, Tr6, and Tr7. The third insulating film 420 may include, for example, silicon oxide, and the fourth insulating film 422 may include, for example, silicon nitride.

A second insulating interlayer 430 having a second contact plug 440 therein may be formed on the fourth insulating film 422. The second contact plug 440 may contact the second source/drain region 412, thereby being electrically connected to the fourth to seventh transistors Tr4, Tr5, Tr6, and Tr7. The second contact plug 340 may include, for example, doped polysilicon, a metal, and/or a metal nitride.

Seventh and eighth conductive pattern structures 466 and 468 contacting the second contact plug 440 may be formed in the second insulating interlayer 430. In some example embodiments, the seventh conductive pattern structure 466 may include a seventh conductive pattern 456 and a seventh barrier layer pattern 446, and the eighth conductive pattern structure 468 may include an eighth conductive pattern 458 and an eighth barrier layer pattern 448. The seventh barrier layer pattern 446 may cover the seventh conductive pattern 456, and the eighth barrier layer pattern 448 may cover the eighth conductive pattern 458.

Processes substantially the same as or similar to those described above with reference to FIGS. 1 to 5 may be performed, so that third and fourth conductive pattern structures 462 and 464 contacting the second contact plug 440, and a second bonding insulating layer structure 470 may be sequentially formed on the second insulating interlayer 430. In some example embodiments, the third conductive pattern structure 462 may include a third conductive pattern 452 and a third barrier layer pattern 442, and the fourth conductive pattern structure 464 may include a fourth conductive pattern 454 and a fourth barrier layer pattern 444. The third barrier layer pattern 442 may cover the third conductive pattern 452, and the fourth barrier layer pattern 444 may cover the fourth conductive pattern 454.

The third conductive pattern 452 may be formed by a CMP process to have a top surface higher than top surfaces of the third barrier layer pattern 442 and the third insulating interlayer 430. The fourth conductive pattern 454 may be formed by a CMP process to have a top surface higher than top surfaces of the fourth barrier layer pattern 444 and the second insulating interlayer 430.

Figure 20:
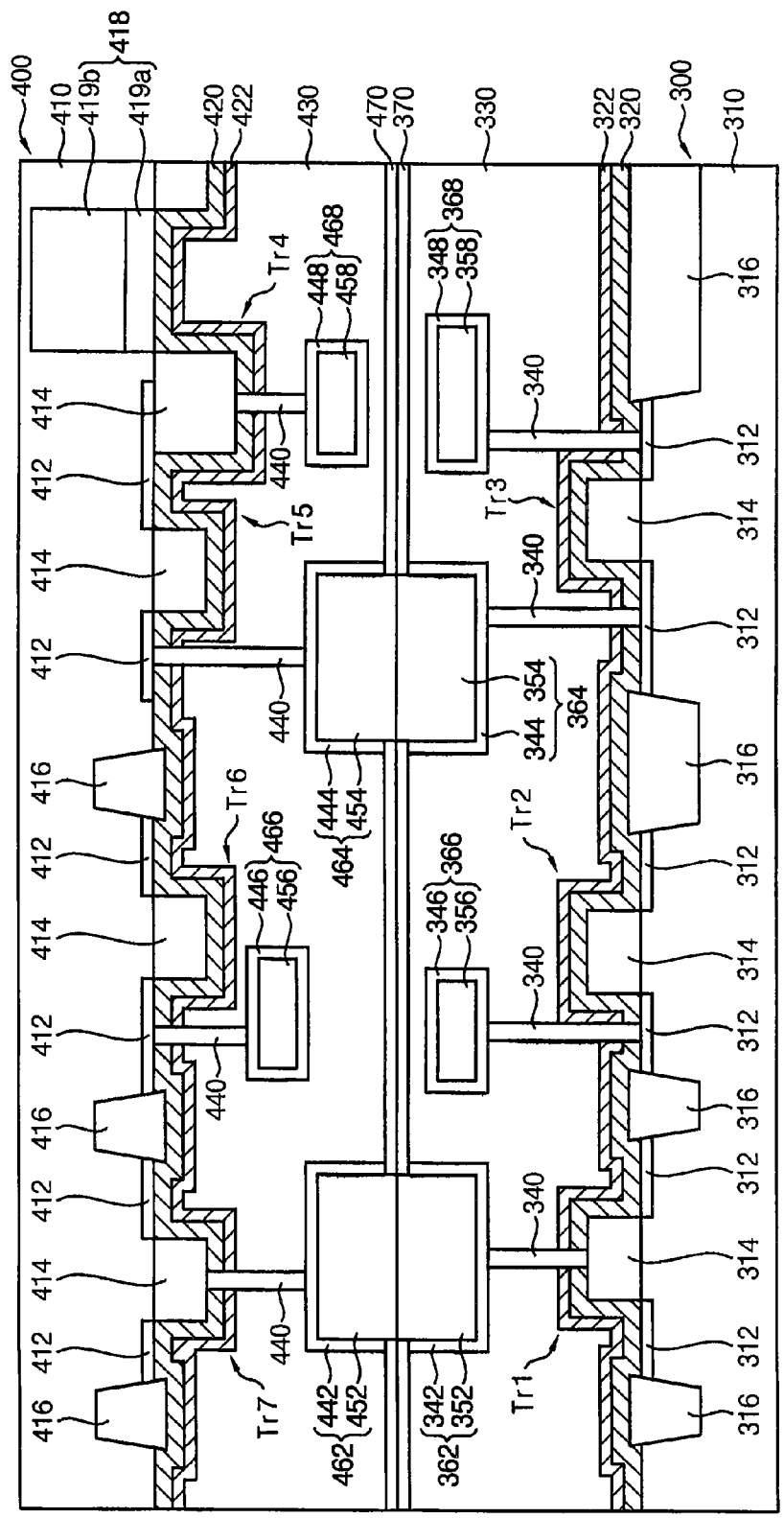

Referring to FIG. 20, the first and second substrates 300 and 400 may be bonded by processes substantially the same as or similar to those discussed above with reference to FIGS. 7 and 8.

Figure 21:
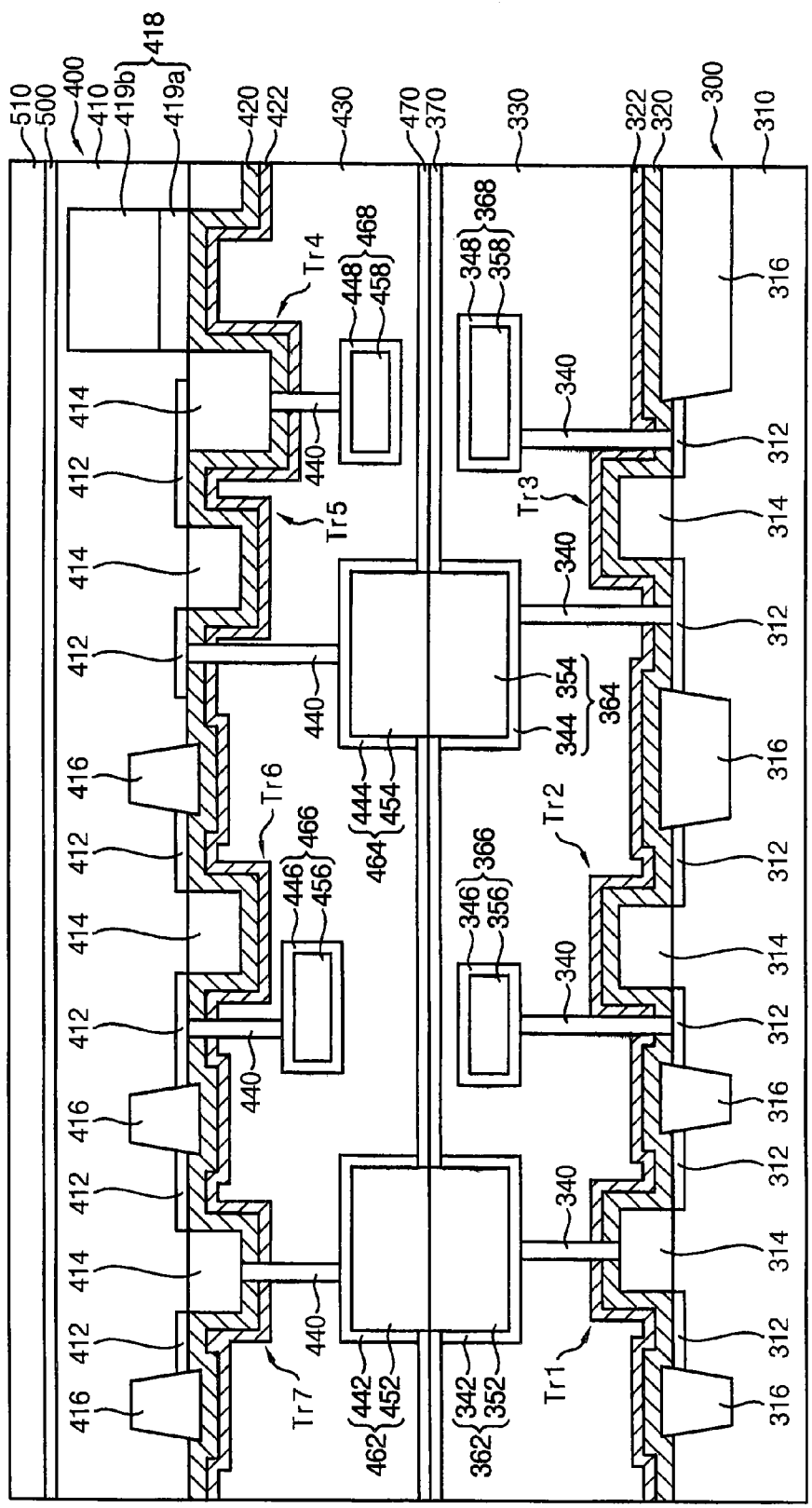

Referring to FIG. 21, an anti-reflective layer 500 and a third insulating interlayer 510 may be sequentially formed on the second substrate 400. The anti-reflective layer 500 may include, for example, hafnium oxide. In some embodiments, the third insulating interlayer 510 may include a material substantially the same as that of the first and second insulating interlayers 330 and 430. The third insulating interlayer 510 may include a nitride, e.g., silicon nitride, or a low-k dielectric material.

Figure 22:
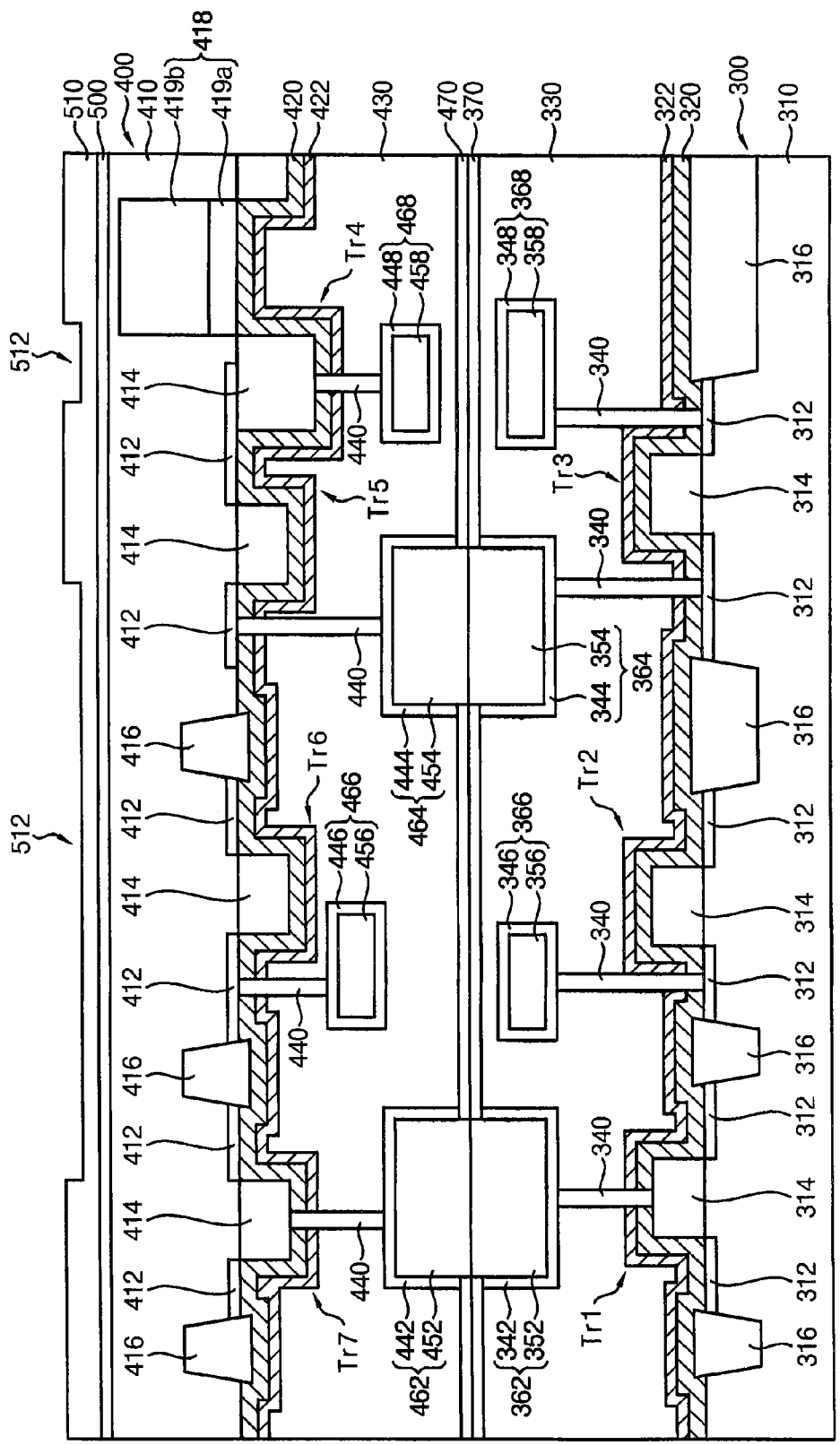

Referring to FIG. 22, a first trench 512 may be formed on the third insulating interlayer 510. In some example embodiments, a plurality of first trenches 512 may be formed.

Figure 23:
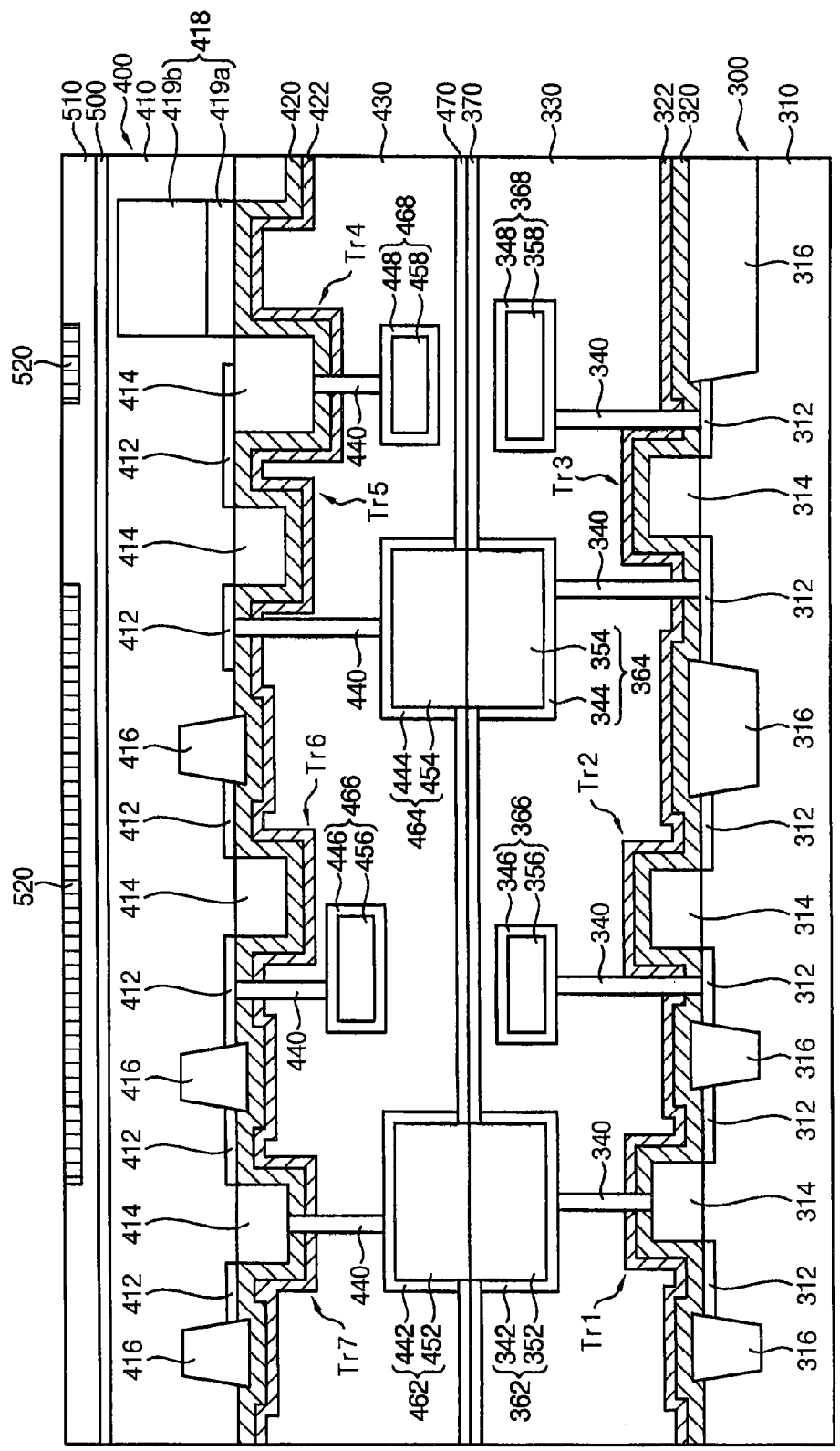

Referring to FIG. 23, a shielding layer may be formed on the third insulating interlayer 510 to sufficiently fill the first trench 512. The shielding layer may be formed of a conductive material, such as copper.

The shielding layer may be planarized until a top surface of the third insulating interlayer 510 is exposed to form a shielding layer pattern 520. The planarization process may include, for example, a CMP process.

Figure 24:
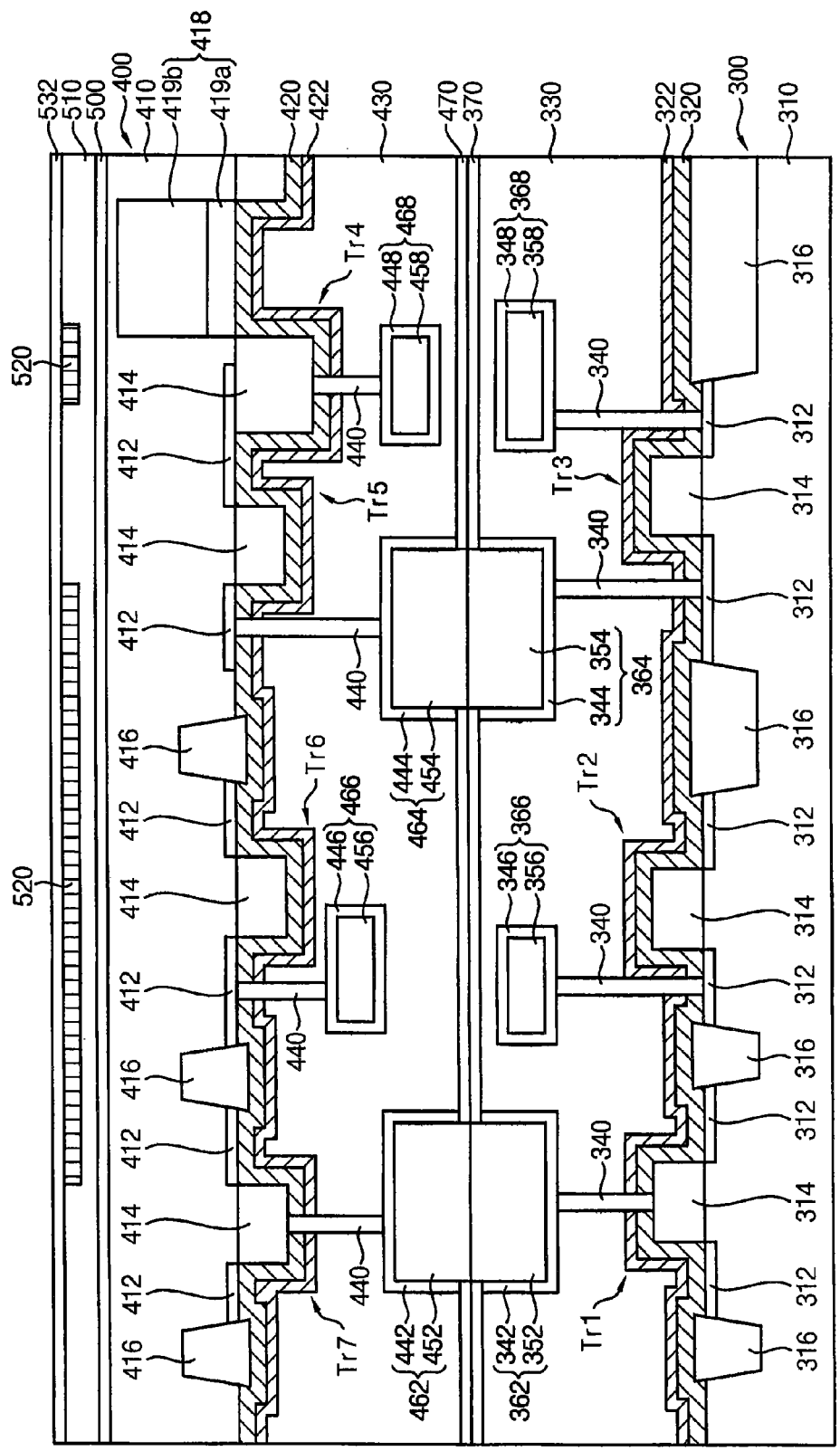

Referring to FIG. 24, a capping layer 532 may be formed on the third insulating interlayer 510 and the shielding layer pattern 520. The capping layer 532 may include a nitride, e.g., silicon nitride, silicon carbonitride, or the like.

Figure 25:
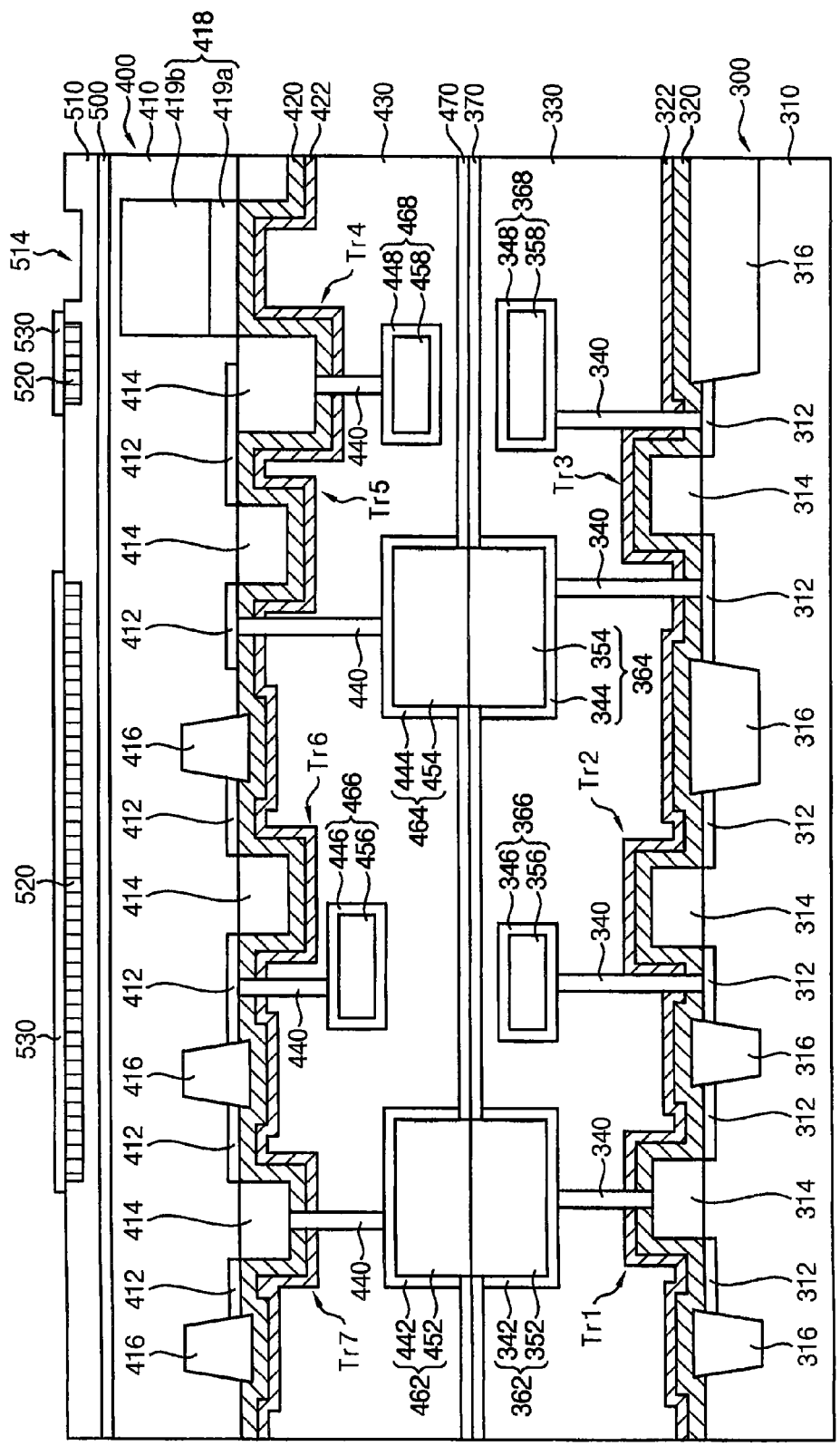

Referring to FIG. 25, the capping layer 532 may be partially etched to form a capping layer pattern 530. The third insulating interlayer 510 may be partially etched to form a second trench 514 thereon. In some example embodiments, the capping layer pattern 530 may cover the shielding layer pattern 520, and the second trench 514 may overlap the photodiode 418.

Figure 26:
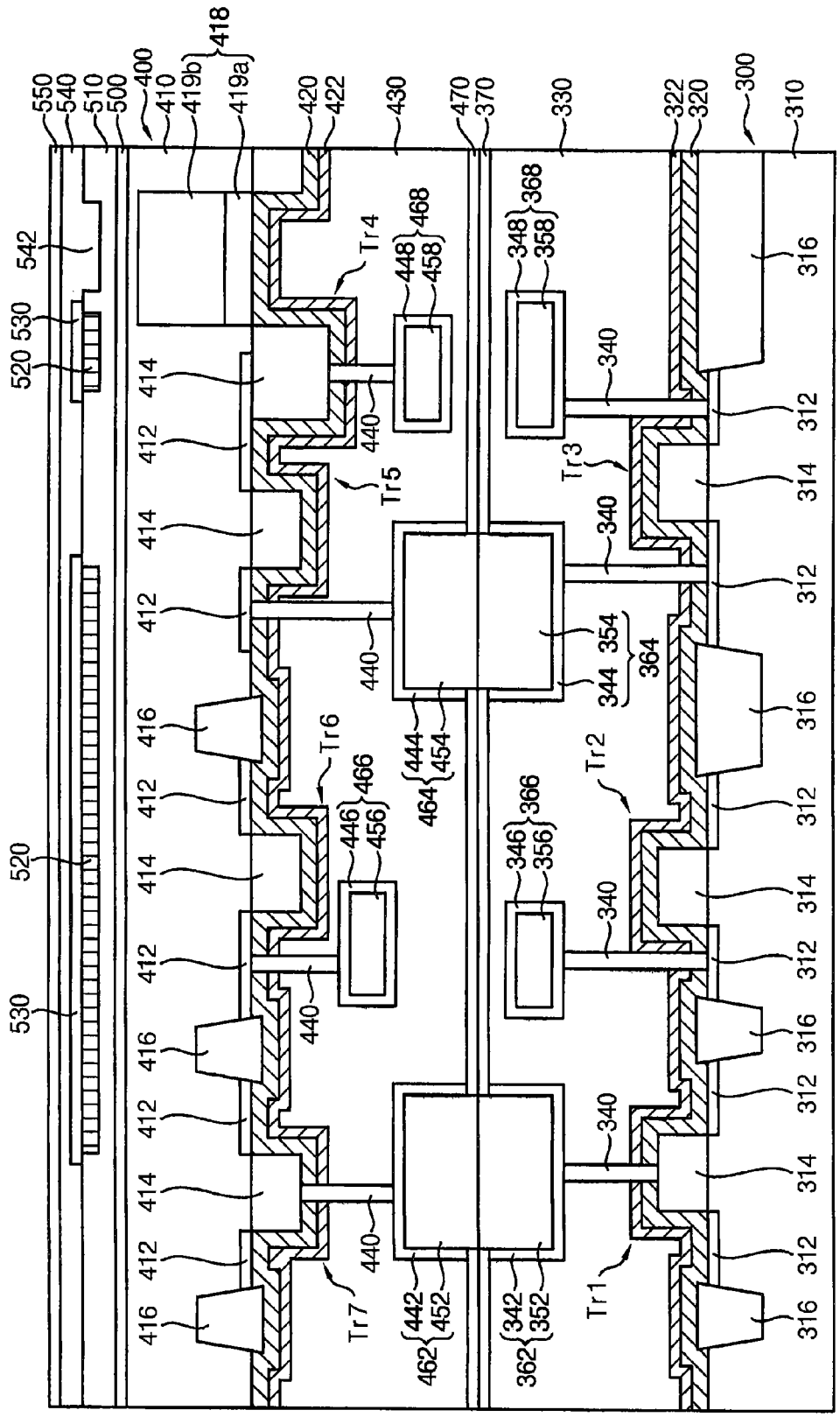

Referring to FIG. 26, a waveguide material layer 540 may be formed on the third insulating interlayer 510 and capping layer pattern 530, filling the second trench 514. The waveguide material layer 540 may include a nitride, e.g., silicon nitride.

A portion of the waveguide material layer 540 filling the second trench 514 may form a waveguide 542. The waveguide 542 may efficiently concentrate an incident light on the photodiode 418. A planarization layer 550 may be formed on the waveguide material layer 540.

Figure 27:
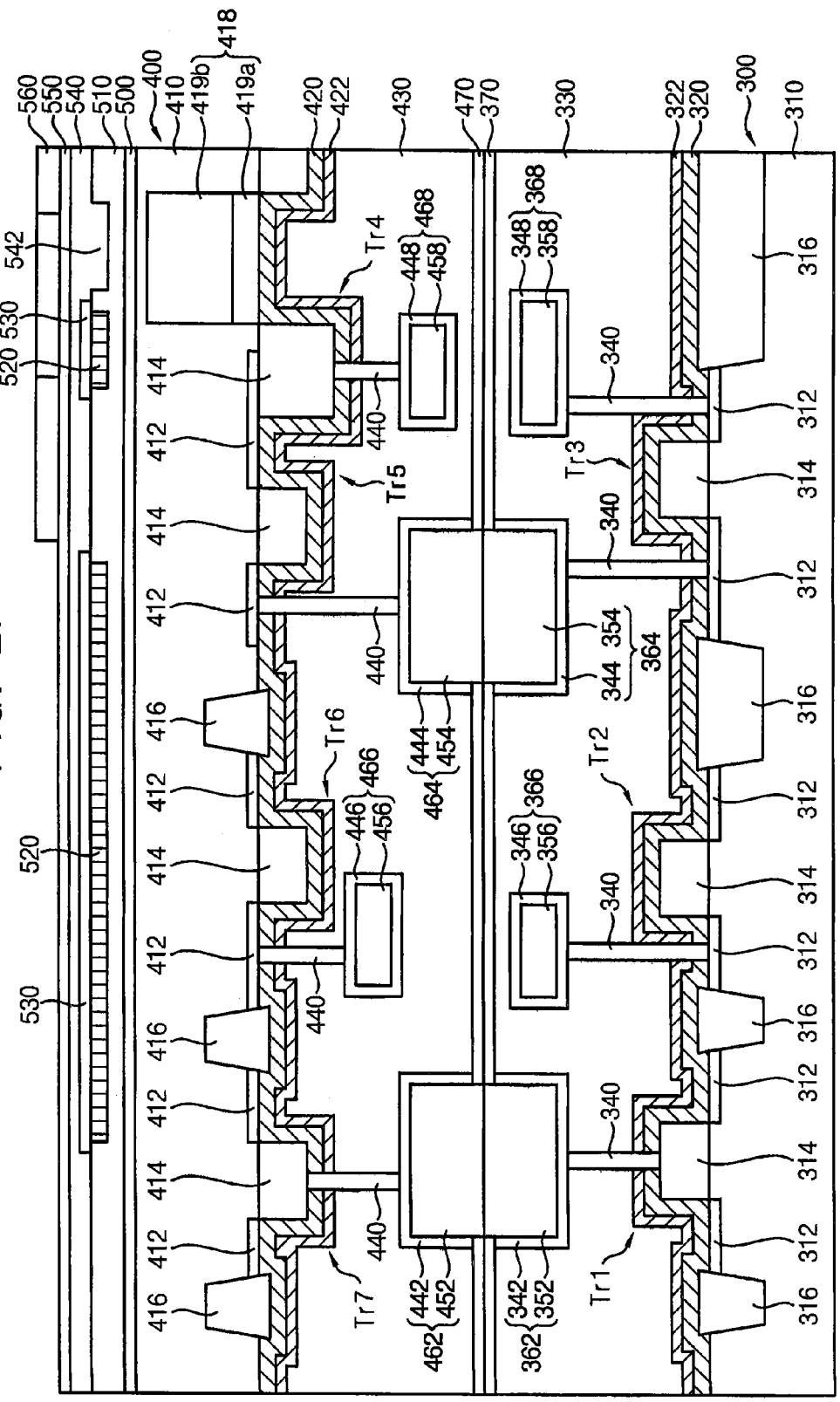

Referring to FIG. 27, a color filter 560 may be formed on the planarization layer 550 to overlap the photodiode 418. Formation of the color filter 560 may include forming an organic layer containing red, green, or blue pigment and patterning the organic layer.

Figure 28:
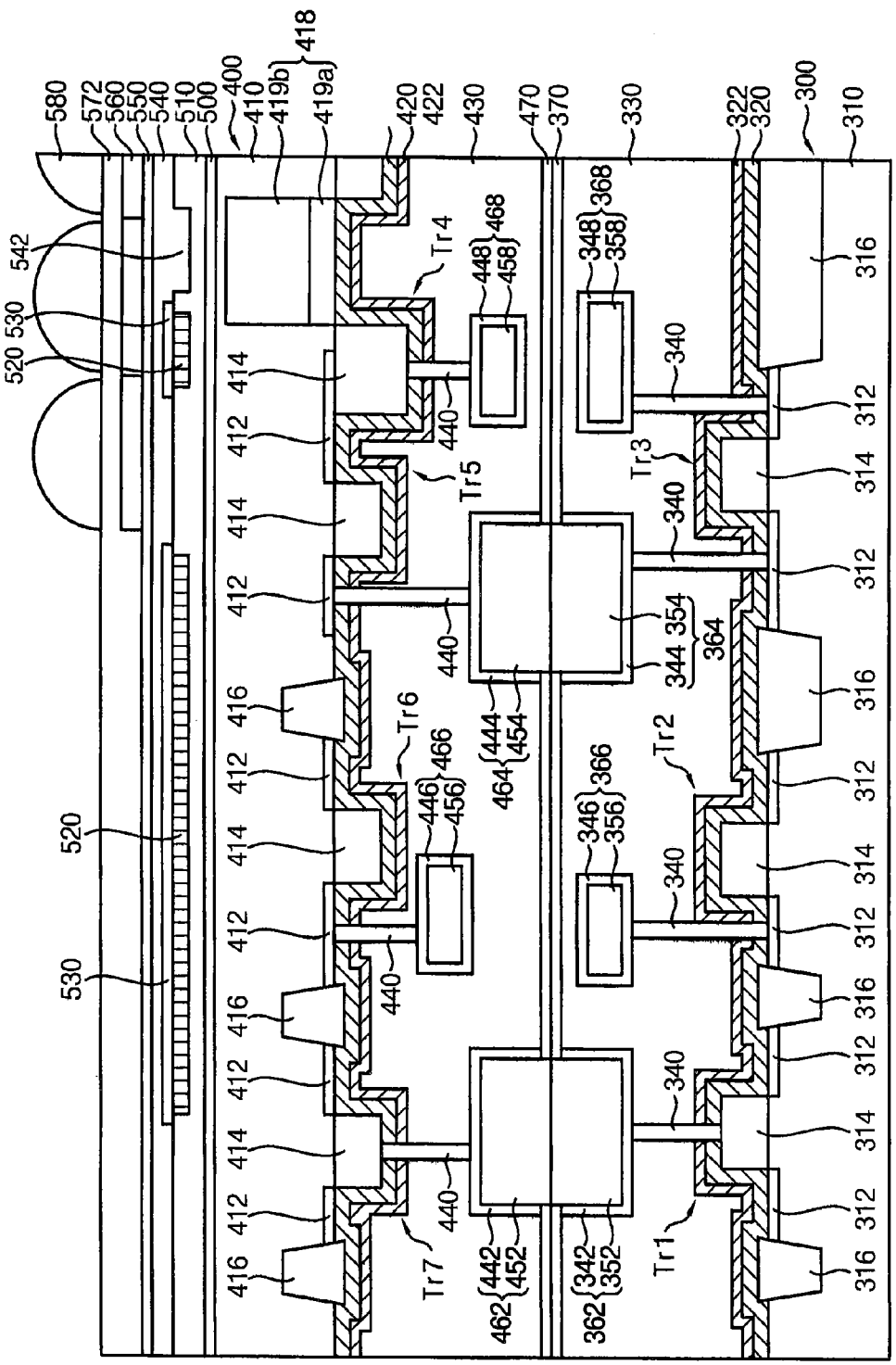

Referring to FIG. 28, a lens material layer 572 may be formed on the planarization layer 550 and the color filter 560. The lens material layer 572 may include an organic material or an inorganic material (e.g., silicon oxide, silicon nitride, silicon oxynitride, or the like). A resist film 580 may be formed on the lens material layer 572 in a pixel region.

Figure 29:
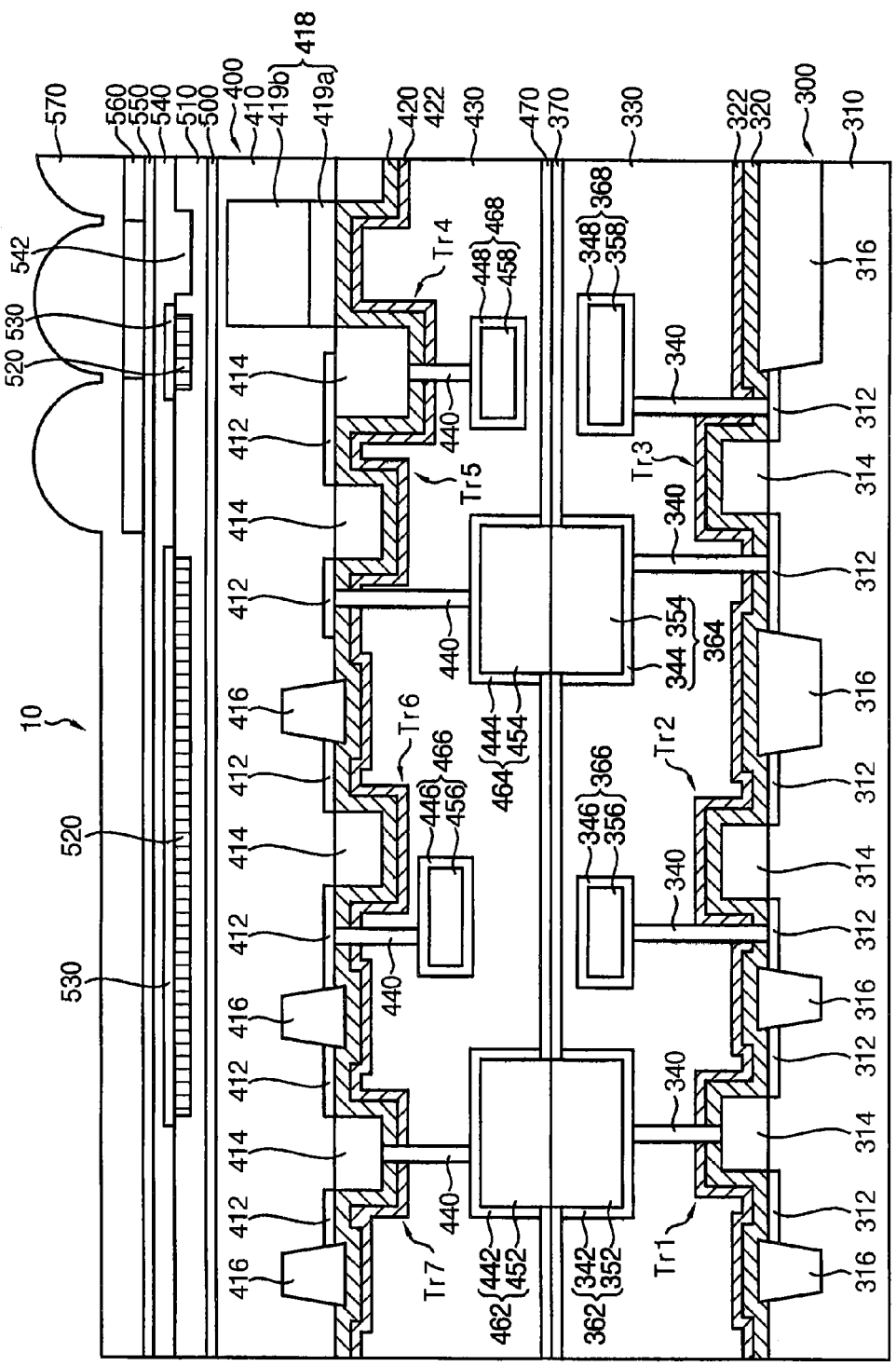

Referring to FIG. 29, a lens 570 may be formed by etching the lens material layer 572 so that a shape of the resist film 580 may be transferred. Light incident on the lens 570 of a semiconductor device 10 may pass through the color filter 560 and the waveguide 542, and may be concentrated onto the photodiode 418, which converts the light into electrical energy.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming a first opening in a first insulating interlayer on a first substrate;
   forming a first barrier layer in the first opening and on portions of the first insulating interlayer adjacent the first opening;
   forming a first conductive layer on the first barrier layer;

chemical mechanical polishing the first conductive layer and the first barrier layer to expose a top surface of the first insulating interlayer and form a first conductive pattern structure having a first barrier layer pattern and a first conductive pattern on the first barrier layer pattern, the first conductive pattern having a top surface higher than a top surface of a portion of the first barrier layer pattern on a sidewall of the first insulating interlayer in the first opening;

forming a first bonding insulating layer structure on the first conductive pattern structure and the first insulating interlayer;

planarizing the first bonding insulating layer structure to expose a top surface of the first conductive pattern structure;

forming a second opening in a second insulating interlayer on a second substrate;

forming a second barrier layer in the second opening and on portions of the second insulating interlayer adjacent the second opening;

forming a second conductive layer on the second barrier layer;

chemical mechanical polishing the second conductive layer and the second barrier layer to expose a top surface of the second insulating interlayer and form a second conductive pattern structure having a second barrier layer pattern and a second conductive pattern on the second barrier layer pattern, the second conductive pattern having a top surface higher than a top surface of a portion of the second barrier layer pattern on a sidewall of the second insulating interlayer in the second opening;

forming a second bonding insulating layer structure on the second conductive pattern structure and the second insulating interlayer;

planarizing the second bonding insulating layer structure to expose a top surface of the second conductive pattern structure; and bonding the first and second substrates together with the first and second conductive pattern structures in contact with each other.

2. The method of claim 1,
wherein chemical mechanical polishing the first conductive layer and the first barrier layer leaves the top surface of the first barrier layer on the sidewall of the first insulating interlayer in the first opening substantially coplanar with the top surface of the first insulating interlayer, and
wherein chemical mechanical polishing the second conductive layer and the second barrier layer leaves the top surface of the second barrier layer on the sidewall of the second insulating interlayer in the second opening substantially coplanar with the top surface of the second insulating interlayer.

3. The method of claim 1,
wherein chemical mechanical polishing the first conductive layer and the first barrier layer leaves the top surface of the first barrier layer on the sidewall of the first insulating interlayer in the first opening lower than the top surface of the first insulating interlayer, and
wherein chemical mechanical polishing the second conductive layer and the second barrier layer leaves the top surface of the second barrier layer on the sidewall of the second insulating interlayer in the second opening lower than the top surface of the second insulating interlayer.

4. The method of claim 1, further comprising forming a third insulating interlayer between the first substrate and the first insulating interlayer, the third insulating interlayer containing a third conductive pattern structure therein,
wherein the first opening exposes a top surface of the third conductive pattern structure.

5. The method of claim 4, further comprising forming a first etch stop layer between the third insulating interlayer and the first insulating interlayer, the first etch stop layer including silicon nitride, silicon carbonitride, silicon carbide, and/or silicon oxynitride,
wherein forming the first opening comprises removing portions of the first insulating interlayer and the first etch stop layer to expose the top surface of the third conductive pattern structure.

6. The method of claim 1, further comprising performing a plasma treatment on at least one of the first and second substrates having the first and second conductive pattern structures thereon prior to bonding the first and second substrates together.

7. The method of claim 6, wherein the plasma treatment uses a nitrogen plasma, an oxygen plasma, a hydrogen plasma, a mixed plasma including nitrogen and hydrogen, a tetrafluoromethane ($CF_4$) plasma, and/or an ammonia plasma.

8. The method of claim 1,
wherein planarizing the first bonding insulating layer structure to expose a top surface of the first conductive pattern structure comprises chemical mechanical polishing the first bonding insulating layer structure, and
wherein planarizing the second bonding insulating layer structure to expose a top surface of the second conductive pattern structure comprises chemical mechanical polishing the second bonding insulating layer structure.

9. The method of claim 1,
wherein the first bonding insulating layer structure comprises at least two bonding insulating layers comprising different materials, and
wherein the second bonding insulating layer structure comprises at least two bonding insulating layers comprising different materials.

10. The method of claim 9,
wherein at least one of the bonding insulating layers in each of the first and second bonding insulating layer structures comprises silicon carbonitride, and
wherein at least one of the bonding insulating layers in each of the first and second bonding insulating layer structures comprises silicon nitride.

11. A method of manufacturing a semiconductor device, the method comprising:
forming a third insulating interlayer on a first substrate, the third insulating interlayer containing a third conductive pattern structure therein;
sequentially forming a first etch stop layer and a first insulating interlayer on the third insulating interlayer to cover the third conductive pattern structure;
forming a first opening through the first insulating interlayer and the first etch stop layer to expose a top surface of the third conductive pattern structure;
forming a first barrier layer on the exposed top surface of the third conductive pattern structure, a sidewall of the first opening, and the first insulating interlayer;
forming a first conductive layer on the first barrier layer to fill a remaining portion of the first opening;
performing a CMP process on the first conductive layer and the first barrier layer until a top surface of the first insulating interlayer is exposed to form a first conductive pattern structure having a first barrier layer pattern and a first conductive pattern, the first conductive pattern having a top surface higher than a top surface of the first barrier layer pattern;

forming a first bonding insulating layer structure on the first conductive pattern structure and the first insulating interlayer;

planarizing the first bonding insulating layer structure until a top surface of the first conductive pattern structure is exposed;

forming a fourth insulating interlayer on a second substrate, the fourth insulating interlayer containing a fourth conductive pattern structure therein;

sequentially forming a second etch stop layer and a second insulating interlayer on the fourth insulating interlayer to cover the fourth conductive pattern structure;

forming a second opening through the second insulating interlayer and the second etch stop layer to expose a top surface of the fourth conductive pattern structure;

forming a second barrier layer on the exposed top surface of the fourth conductive pattern structure, a sidewall of the second opening, and the second insulating interlayer;

forming a second conductive layer on the second barrier layer to fill a remaining portion of the second opening;

performing a CMP process on the second conductive layer and the second barrier layer until a top surface of the second insulating interlayer is exposed to form a second conductive pattern structure having a second barrier layer pattern and a second conductive pattern, the second conductive pattern having a top surface higher than a top surface of the second barrier layer pattern;

forming a second bonding insulating layer structure on the second conductive pattern structure and the second insulating interlayer;

planarizing the second bonding insulating layer structure until a top surface of the second conductive pattern structure is exposed;

performing a plasma treatment on at least one of the first and second substrates having the first and second conductive pattern structures thereon, respectively; and bonding the first and second substrates with each other so that the first and second conductive pattern structures contact with each other.

12. The method of claim 11,
wherein performing the CMP process on the first conductive layer and the first barrier layer includes forming the first barrier layer pattern having a top surface substantially coplanar with the top surface of the first insulating interlayer, and
wherein performing the CMP process on the second conductive layer and the second barrier layer includes forming the second barrier layer pattern having a top surface substantially coplanar with the top surface of the second insulating interlayer.

13. The method of claim 11,
wherein performing the CMP process on the first conductive layer and the first barrier layer includes forming the first barrier layer pattern having a top surface lower than the top surface of the first insulating interlayer, and
wherein performing the CMP process on the second conductive layer and the second barrier layer includes forming the second barrier layer pattern having a top surface lower than the top surface of the second insulating interlayer.

14. The method of claim 11,
wherein the first bonding insulating layer structure includes a third bonding insulating layer and a first bonding insulating layer sequentially stacked, the third and first bonding insulating layers including different materials from each other, and
wherein the second bonding insulating layer structure includes a fourth bonding insulating layer and a second bonding insulating layer sequentially stacked, the fourth and second bonding insulating layers including different materials from each other.

15. The method of claim 11,
wherein planarizing the first bonding insulating layer structure until a top surface of the first conductive pattern structure is exposed includes performing a CMP process on the first bonding insulating layer, and
wherein planarizing the second bonding insulating layer structure until a top surface of the second conductive pattern structure is exposed includes performing a CMP process on the second bonding insulating layer.

16. A method comprising:
forming a first insulating layer on a substrate;
forming an opening in the first insulating layer;
forming a barrier layer on the first insulating layer and conforming to sidewalls of the first insulating layer in the opening;
forming a conductive layer on the barrier layer;
chemical mechanical polishing to expose the first insulating layer and leave a barrier layer pattern in the opening and a conductive layer pattern on the barrier layer pattern in the opening, wherein a portion of the conductive layer pattern protrudes above an upper surface of the first insulating layer that is coplanar with an upper surface of the barrier layer pattern;
forming a second insulating layer on the first insulating layer, the barrier layer pattern and the conductive layer pattern; and
planarizing the second insulating layer to expose the conductive layer pattern.

17. The method of claim 16, wherein forming the opening in the first insulating layer exposes a conductive region, and wherein the barrier layer pattern conforms to an upper surface of the conductive region.

18. The method of claim 16, wherein the second insulating layer is formed into a single layer that covers the first insulating layer, the barrier layer pattern, and the conductive layer pattern conformal with the portion of the conductive layer pattern that protrudes.

19. The method of claim 16, wherein the second insulating layer is formed into a double layer that covers the first insulating layer, the barrier layer pattern, and the conductive layer pattern conformal with the portion of the conductive layer pattern that protrudes, the double layer having:
a first layer on the first insulating layer, the barrier layer pattern, and the conductive layer pattern; and
a second layer on the first layer.

20. The method of claim 19, wherein the first layer comprises silicon nitride (SiN) and the second layer comprises silicon carbonitride (SiCN).

* * * * *